United States Patent
Spangler et al.

(10) Patent No.: US 6,650,666 B2
(45) Date of Patent: *Nov. 18, 2003

(54) LASER WAVELENGTH CONTROL UNIT WITH PIEZOELECTRIC DRIVER

(75) Inventors: Ronald L. Spangler, Arlington, MA (US); Robert N. Jacques, Andover, MA (US); John A. Rule, Hingham, MA (US); Frederick A. Palenschat, Lemon Grove, CA (US); Igor V. Fomenkov, San Diego, CA (US); John M. Algots, San Diego, CA (US); Jacob P. Lipcon, Winchester, MA (US); Richard L. Sandstrom, Encinitas, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/027,210

(22) Filed: Dec. 21, 2001

(65) Prior Publication Data

US 2002/0154669 A1 Oct. 24, 2002

Related U.S. Application Data

(63) Continuation-in-part of application No. 09/794,782, filed on Feb. 27, 2001, now Pat. No. 6,532,247, and a continuation-in-part of application No. 09/684,629, filed on Oct. 6, 2000, now Pat. No. 6,442,181, and a continuation-in-part of application No. 09/597,812, filed on Jun. 19, 2000, now Pat. No. 6,529,531, and a continuation-in-part of application No. 09/501,160, filed on Feb. 9, 2000, now Pat. No. 6,621,846.

(51) Int. Cl.[7] .............................. H01S 3/10; H01S 3/22; H01S 3/223

(52) U.S. Cl. .......................................... 372/20; 372/57

(58) Field of Search ................ 372/20, 57, 32

(56) References Cited

U.S. PATENT DOCUMENTS

| 5,285,457 A | 2/1994 | Funakubo et al. |
| 5,608,561 A | 3/1997 | Marcuse et al. |
| 5,835,520 A | 11/1998 | Das et al. |
| 5,856,991 A | 1/1999 | Ershov |
| 6,020,098 A | 2/2000 | Bretscher et al. |
| 6,078,599 A | 6/2000 | Everage et al. |
| 6,330,253 B1 | 12/2001 | Tuganov et al. |

Primary Examiner—Paul Ip
Assistant Examiner—Davienne N Monbleau
(74) Attorney, Agent, or Firm—William Cray

(57) ABSTRACT

An electric discharge laser with fast wavelength correction. Fast wavelength correction equipment includes at least one piezoelectric drive and a fast wavelength measurement system and fast feedback response times. In a preferred embodiment, equipment is provided to control wavelength on a slow time frame of several milliseconds, on an intermediate time from of about one to five milliseconds and on a very fast time frame of a few microseconds. Preferred techniques include a combination of a relatively slow stepper motor and a very fast piezoelectric driver for tuning the laser wavelength using a tuning mirror. A preferred control technique is described (utilizing a very fast wavelength monitor) to provide the slow and intermediate wavelength control with the combination of a stepper motor and a piezoelectric driver. Very fast wavelength control is provided with a piezoelectric load cell in combination with the piezoelectric driver. Preferred embodiments provide (1) fast feedback control based on wavelength measurements, (2) fast vibration control, (3) active damping using the load cell and an active damping module, (4) transient inversion using feed forward algorithms based on historical burst data. A preferred embodiment adapts the feed forward algorithms to current conditions. Another preferred embodiment measures tuning mirror position to permit wavelength pretuning and active wavelength tuning.

13 Claims, 21 Drawing Sheets

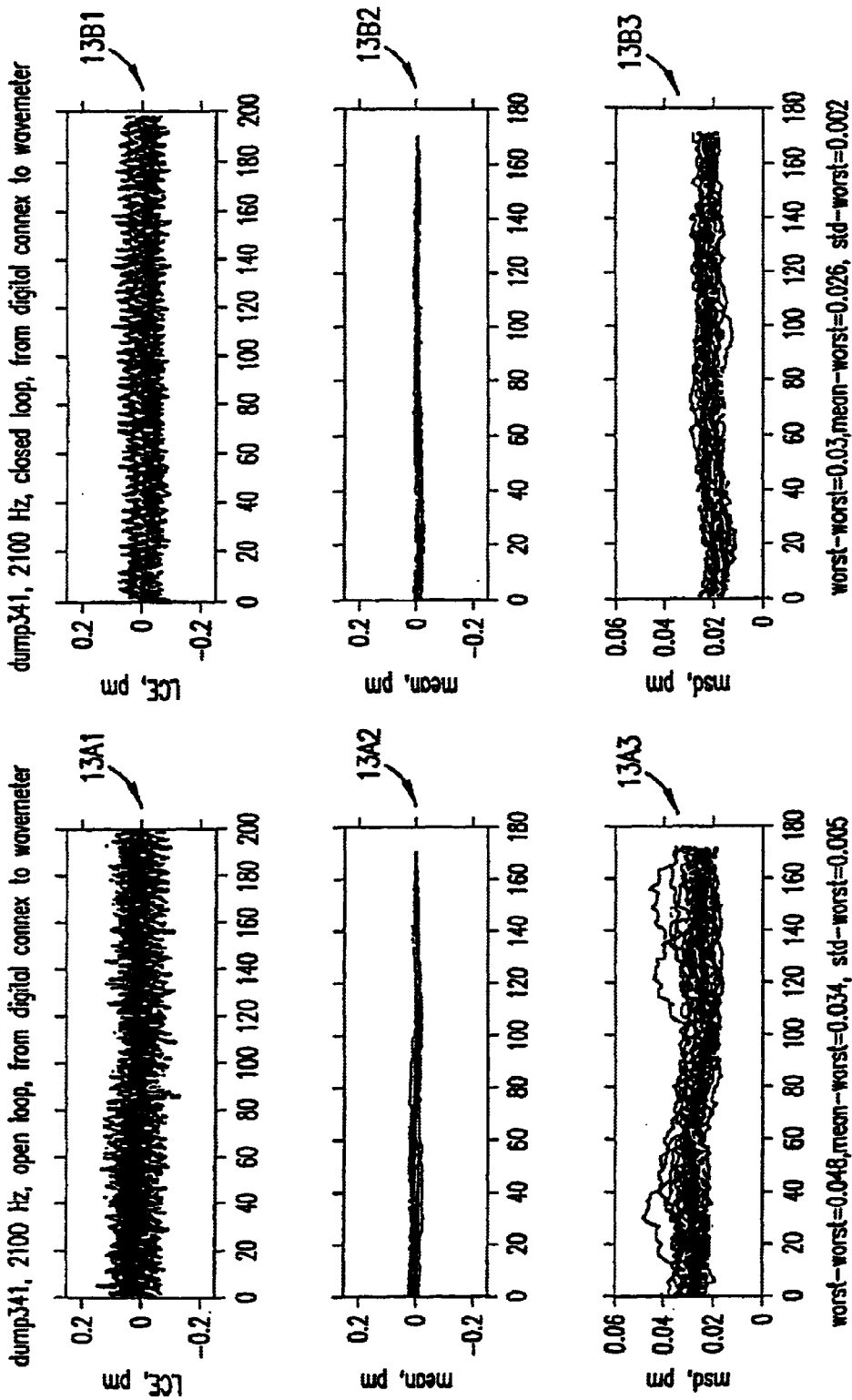

LASER WAVELENGTH CONTROL UNIT WITH PIEZOELECTRIC DRIVER

This application is a continuation-in-part of Ser. No. 09/501,160 filed Feb. 9, 2000, now U.S. Pat. No. 6,621,846 Ser. No. 09/597,812, filed Jun. 19, 2000 now U.S. Pat. No. 6,529,531 and Ser. No. 09/684,629, filed Oct. 6, 2000 now U.S. Pat. No. 6,442,181 and Ser. No. 09/794,782, filed Feb. 27, 2001 now U.S. Pat. No. 6,532,247. This invention relates to lasers and, in particular, to correcting wavelength shift in lasers.

FIELD OF THE INVENTION

Background of the Invention

Light Sources For Integrated Circuit Fabrication

An important use of gas discharge excimer lasers is to provide high quality light sources for integrated circuit fabrication. These light sources are used by stepper machines and scanner machines for selectively exposing photoresist in a semiconductor wafer fabrication process. In such fabrication processes, the optics in the stepper and scanner machines are designed for a particular laser beam with a narrow band of wavelengths. The output beam of the excimer laser is typically comprised of a very narrow band of wavelengths distributed about a "central" wavelength (referred to as the "line center" wavelength) approximately in a gausian distribution. For krypton fluoride (KrF) and argon fluoride (ArF) excimer lasers the output beam is "line narrowed" to produce the desired narrow band of wavelengths. The laser center line wavelength may drift over time and, thus, a feedback network is typically employed to detect the wavelength of the laser and to control the wavelength within a desired range.

Prior Art Wavelengths Controls

In one type of feedback network used to detect and adjust the wavelength of a laser, a grating and an etalon each receive a small portion of the emitted light from the laser. The spatial position of a band of light reflected from the grating determines the center line wavelength of the laser beam to a coarse degree. The etalon creates an interference pattern having concentric bands of dark and light levels due to destructive and constructive interference by the laser light. The concentric bands surround a center bright portion. The diameter of one of the concentric bands is used to determine the center line wavelength of the laser to a fine degree, such as to within 0.01–0.03 pm.

Various feedback methods are well known for wavelength tuning of lasers using the measured wavelength values. Typically the tuning takes place in the same device that line narrows the laser output. This device is referred to as a line narrowing package (LNP) or line narrowing module. A typical technique used for line narrowing and tuning of excimer lasers is to provide a window at the back of the laser's discharge cavity through which a portion of the laser beam passes into the LNP. There, the portion of the beam is expanded with a prism beam expander and directed to a grating which reflects a narrow selected portion of the laser's broader spectrum back into the discharge chamber where it is amplified. The laser is typically tuned by changing the angle at which the beam illuminates the grating. This may be done by adjusting the position of the grating or providing a mirror adjustment in the beam path. The wavelength of the beam is measured for each pulse and an error signal is calculated and used as a feedback signal to position the grating or the mirror to minimize the error. These prior art wavelength control techniques are very effective in maintaining average wavelength values within a desired range over relatively long time periods. However, they have not been very effective in controlling wavelengths over short time periods of about 3 to 30 milliseconds or very short time periods of about 1–3 milliseconds or less. Prior art wavelength feedback control techniques had response times of a few milliseconds which was the time required to detect a shift in the wavelength and adjust the illumination angle.

Wavelength Chirp

A typical mode of operation for an excimer laser used as a light source for integrated circuit fabrication is known as "burst" mode operation. In this mode, the laser beam illuminates a dye spot on a silicon wafer with a "burst" of, for example, 250 pulses at a pulse rate of 2000 Hz (in this case) in 0.125 seconds. The laser is then "off" for about 0.2 seconds while the lithography machine moves optical components so as to cause the next burst to illuminate the next dye spot. This sequence continues until all of the dye spots in the wafer have been illuminated after which the laser is off for about 1 minute while a new wafer is loaded. FIG. 1 is a graph 10 which illustrates the center line wavelength shift during a burst of pulses from a laser operating at 1000 Hz. In particular, FIG. 1 indicates a wavelength shift of about +0.1 pm to about −0.09 pm from a desired wavelength output over a time period of about 35 milliseconds. Wavelength shifts of this type are referred to as wavelength "chirp". These chirps often are very predictable, coming at the same time (always at the beginning of the burst) during each of many bursts of pulses. As shown in FIG. 1, after the wavelength chirp, the wavelength output settles down to wavelength shifts occurring rapidly and seemingly randomly but with a maximum magnitude of less than about 0.05 pm. Applicants believe that this wavelength chirp near the start of a burst of pulses is primarily due to changing acoustic disturbances within the discharge region of the laser. The pattern of change is affected by the temperature of the laser gas. These shifts occur over time periods in the range of a few to several milliseconds. Conventional wavelength correction techniques do not adequately correct these large and sudden wavelength shifts near the beginning of each burst of pulses.

Vibration

Conventional prior art wavelength correction techniques also are not adequate to correct the small very rapidly occurring (high frequency) wavelength shifts that occur throughout the burst. The high frequency wavelength shifts are believed to be caused primarily by vibrations of the laser optical components including those in the LNP itself. Most of the vibration type shifts are believed to be primarily attributable to laser's rotating fan and its motor drive and to the periodic electric discharges of the laser. Vibration modes may be amplified by resonant conditions of various laser structures including the LNP and its components.

Energy Chirp

Excimer lasers operating in a burst mode also produce a pulse energy chirp similar to the wavelength chirp. Prior art methods have been disclosed to minimize the pulse energy chirp. One such method is described in an article by the inventors' co-workers, "Advanced Krypton Fluoride Excimer Laser for Microlithography, *SPIE* Vol. 1674, "Optical/Laser Microlithography V, (1992) 473–484, see page 480.

What is needed is equipment to control the wavelength of gas discharge lasers over short and very short time periods in the range of a few microseconds to about 5 milliseconds.

SUMMARY OF THE INVENTION

The present invention provides an electric discharge laser with fast wavelength correction. Fast wavelength correction equipment includes at least one piezoelectric drive and a fast wavelength measurement system and fast feedback response times. In a preferred embodiment, equipment is provided to control wavelength on a slow time frame of several milliseconds, on an intermediate time frame of about one to five milliseconds and on a very fast time frame of a few tens of microseconds. Preferred techniques include a combination of a relatively slow stepper motor and a very fast piezoelectric driver for tuning the laser wavelength using a tuning mirror. A preferred control technique is described (utilizing a very fast wavelength monitor) to provide the slow and intermediate wavelength control with the combination of a stepper motor and a piezoelectric driver. Very fast wavelength control is provided with a piezoelectric load cell in combination with the piezoelectric driver. Preferred embodiments provide (1) fast feedback control based on wavelength measurements, (2) fast vibration control, (3) active damping using the load cell and an active damping module, (4) transient inversion using feed forward algorithms based on historical burst data. A preferred embodiment adapts the feed forward algorithms to current conditions. Another preferred embodiment measures tuning mirror position to permit wavelength pretuning and active wavelength tuning.

BRIEF DESCRIPTION OF THE DRAWINGS

FIG. 8 and 8A show a fast mirror driver and a control module.

FIGS. 13A and 13B show test results.

DETAILED DESCRIPTION OF PREFERRED EMBODIMENTS

Wavelength Shifts

FIGS. 2A, 2B, 2C and 2D are graphs 16, 18, 20 and 22, respectively, which illustrate the wavelength shifts over four sequential bursts of pulses from a laser. Graphs 16, 18, 20 and 22 reveal that the shape or pattern of the wavelength drift of the wavelength chirp from a particular laser is very similar from burst-to-burst. Data averaged over 60 pulses is shown as the solid lines in graphs 16, 18, 20 and 22. These data demonstrate a substantial relatively predictable wavelength chirp during the first 30 ms of the bursts and relatively random smaller wavelength shifts throughout the bursts.

Chirp Correction With Prior Art Stepper Motor

Figure 1:
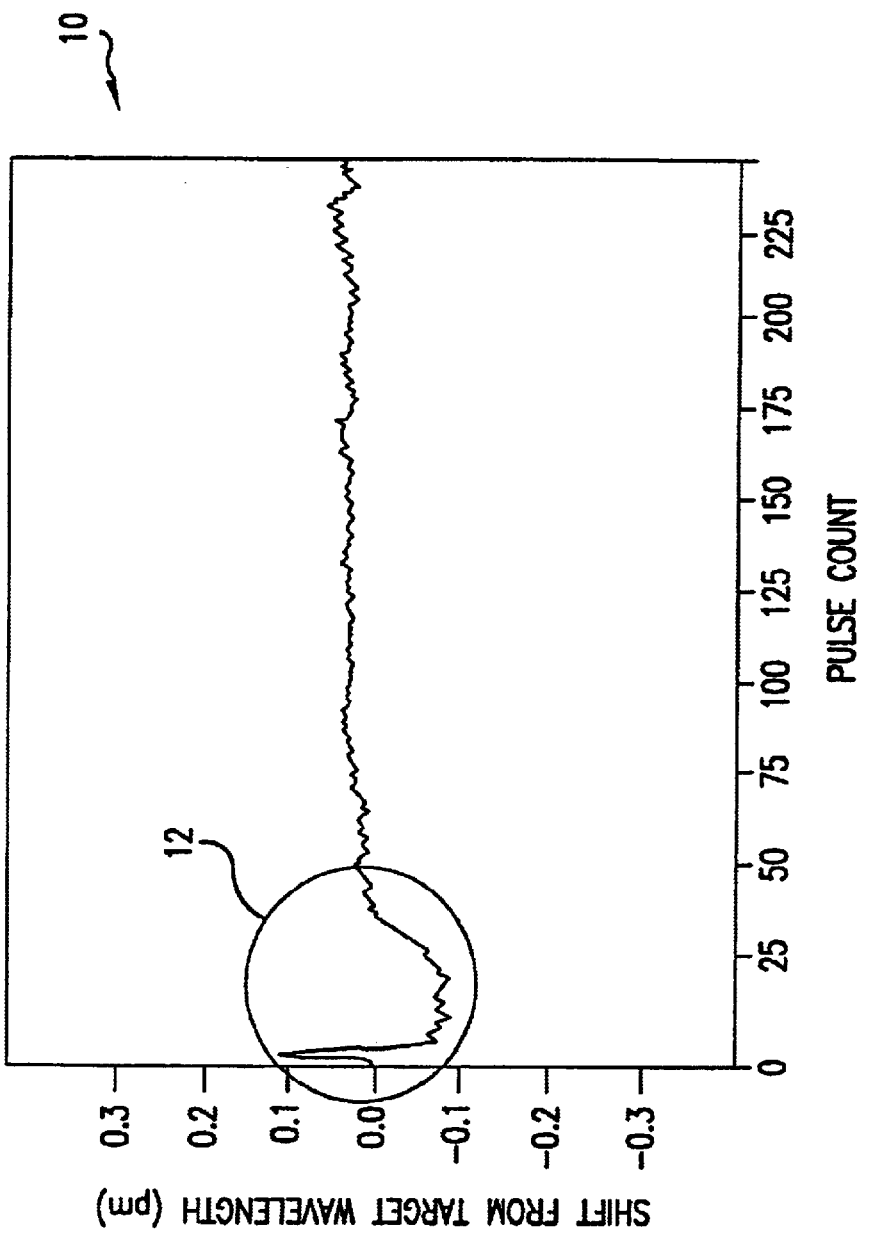
FIG. 1 is a prior art graph of measurements of wavelength drift over a burst of pulses from a laser.
Figure 2A:
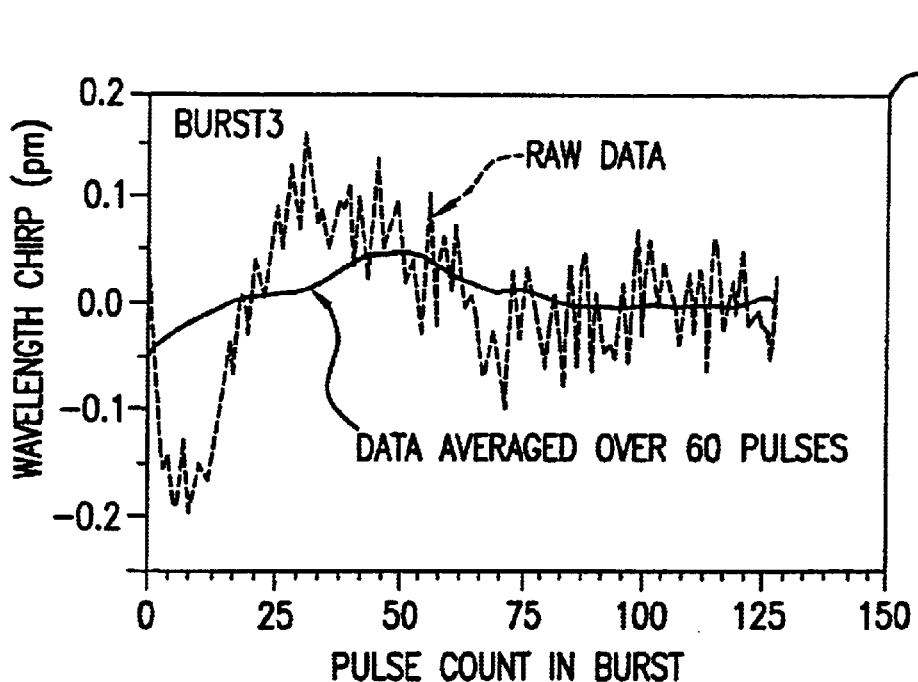
FIGS. 2A–D are prior art graphs of measurements of wavelength drift over four sequential bursts of pulses from a laser.
Figure 2B:
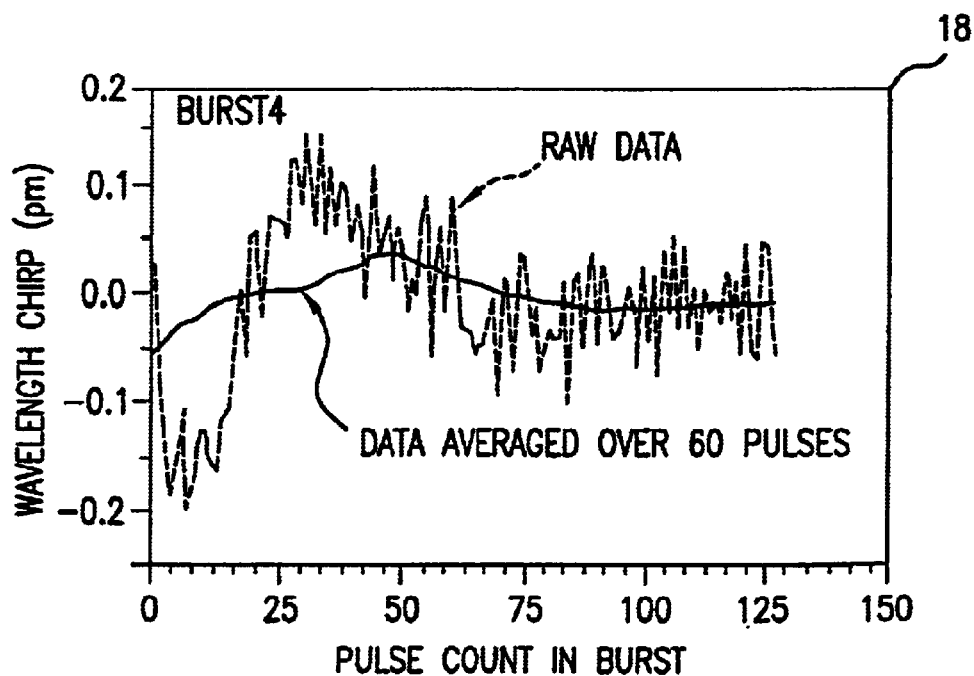
Figure 2C:
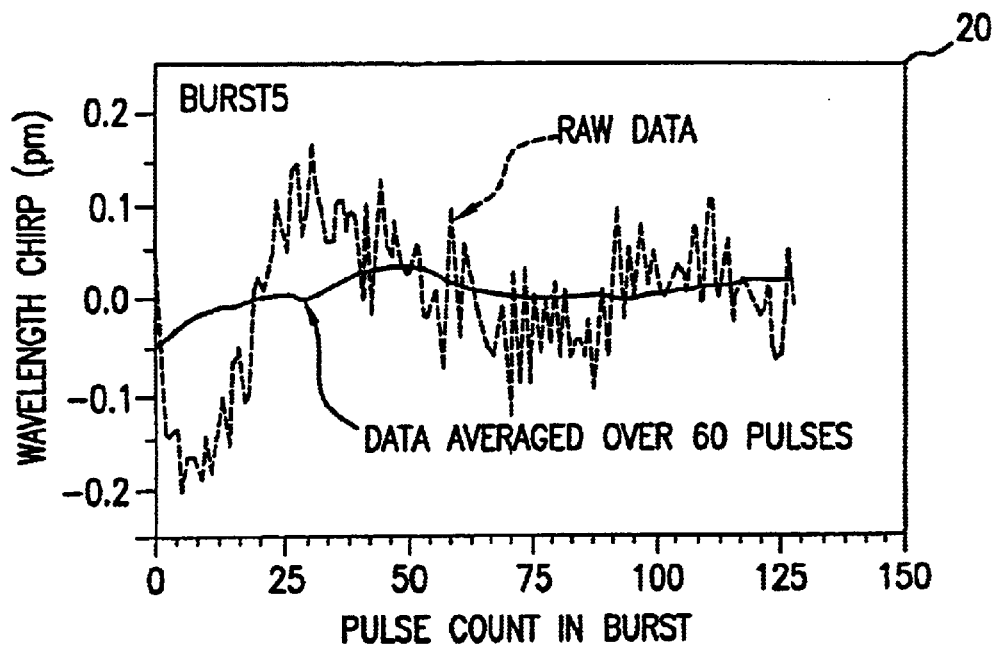
Figure 2D:
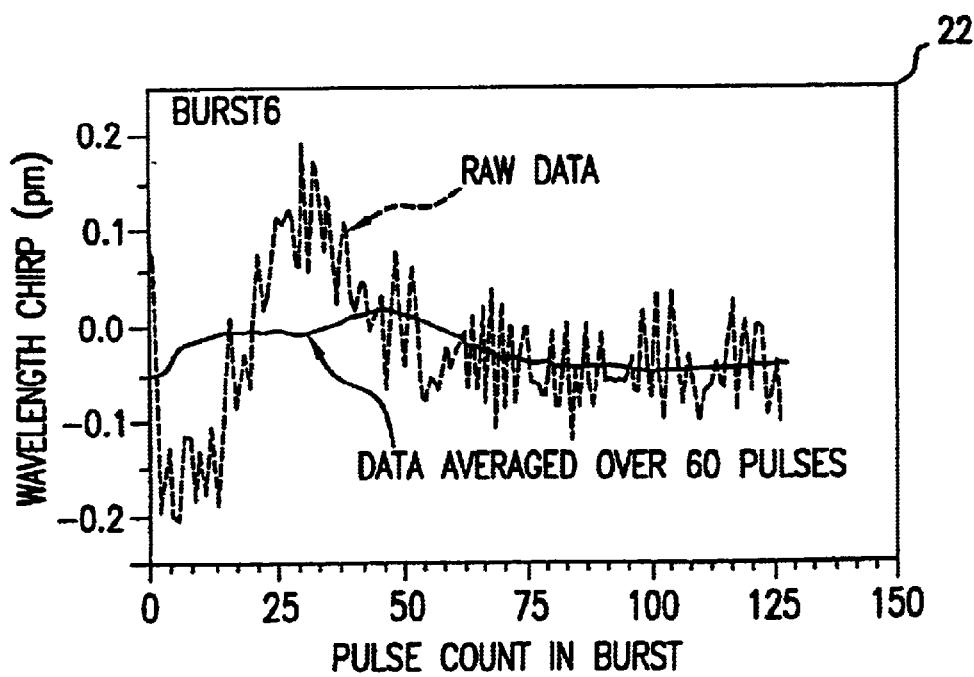
Figure 3:
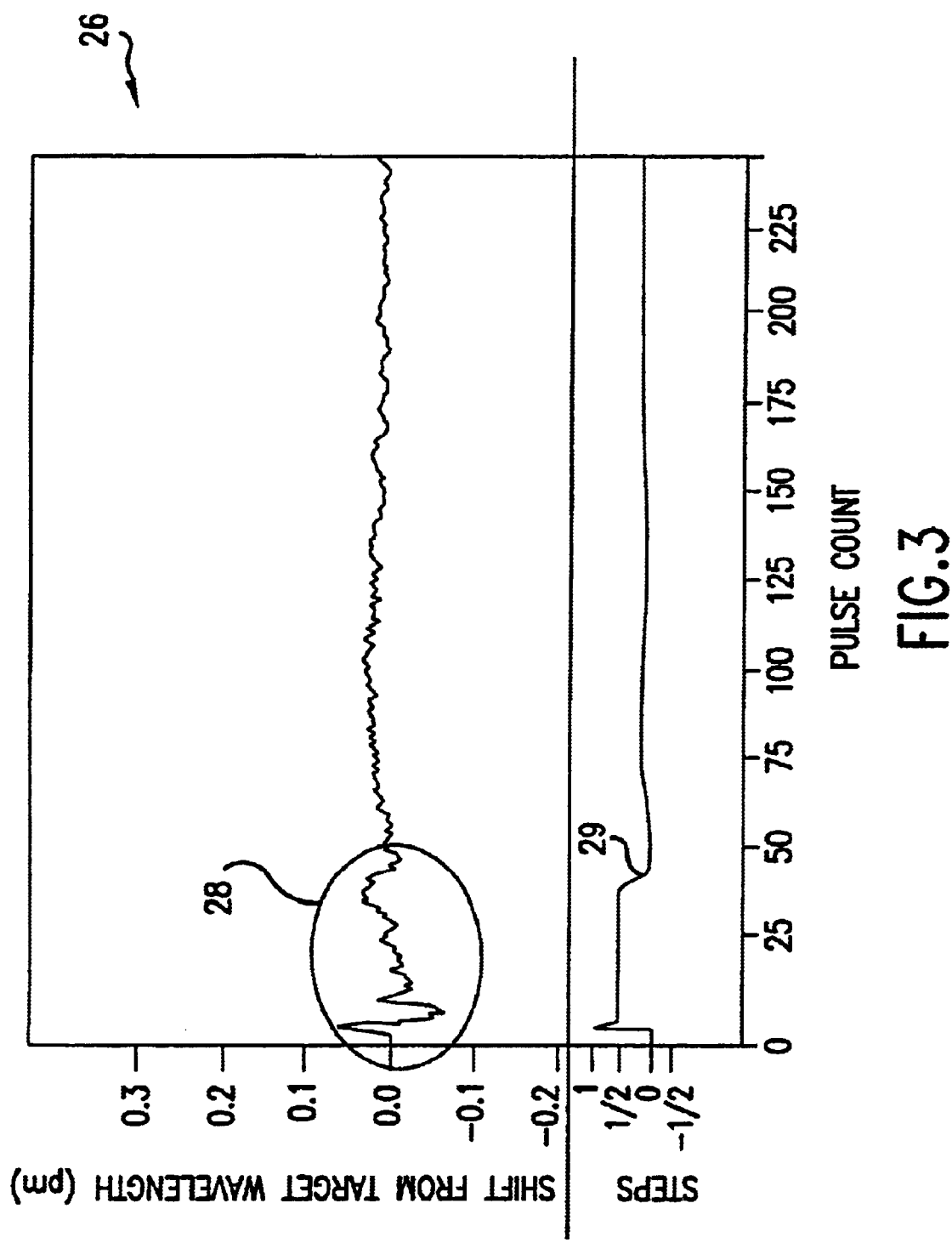
FIG. 3 is a graph of measurements of wavelength drift over a burst of pulses from a laser that has its wavelength output corrected using a slow response stepper motor.

The graph 26 of FIG. 3 illustrates the wavelength shift over a burst of pulses from a laser that has its wavelength output corrected using a prior art stepper motor. A circled section 28 of graph 26 reveals a significant reduction in the magnitude of wavelength drift during the wavelength chirp period of the laser, relative to the circled section 12 of graph 10 of FIG. 1. In particular, the magnitude of the maximum wavelength shift during the wavelength chirp period shown in graph 26 is about 0.05 pm as compared to almost ±0.2 in the uncorrected example shown in the 16–22 charts (FIGS. 2A–D).

Stepper motor control line 29 indicates that a stepper motor, which controls the tuning mirror positions for tuning the laser, takes a full step up at the initiation of the burst, followed by a ½ step down at about pulse 4, followed by another ½ step down at about pulse 36.

FIRST PREFERRED EMBODIMENT

Figure 4:
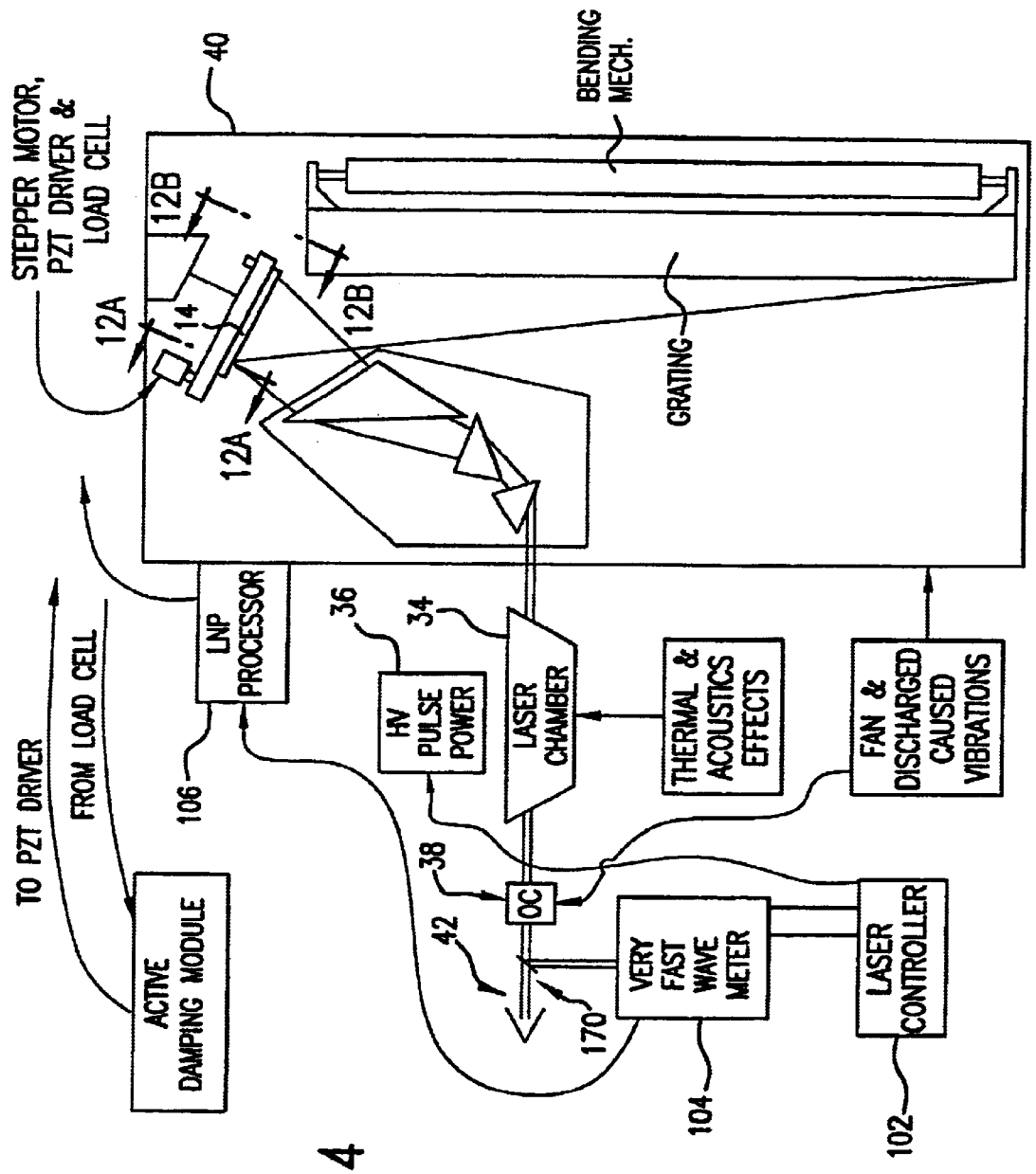
FIGS. 4, 4A and 4B show a proposed technique for providing fast and finer wavelength control.

Important features of a first preferred embodiment of the present invention are shown in FIG. 4. This embodiment shows a KrF excimer laser system useful as a light source for integrated circuit fabrication. The system includes laser chamber 34 which contains a laser gas circulated with a motor driven fan (not shown) between two elongated electrodes (not shown) between which electric discharges are produced at rates of up to 4,000 Hz by a pulse power system 36 controlled by laser controller 102. A resonant cavity defined by output coupler 38 and LNP 40 produces laser beam 42. A portion of laser beam 42 is monitored by very fast wavemeter 104 which provides pulse energy measurements to laser controller 102 for feedback control of the pulse power unit 36 for maintaining pulse power within desired limits. Wavemeter 104 also measures the center-line wavelength of the laser beam and provides a feedback signal to LNP processor which uses the feedback signal to control a stepper motor 82 and a PZT driver 80 (shown in FIG. 4A) to adjust the position of tuning mirror 14 which controls the angle of illumination of an expanded portion of the laser beam on grating 16 in order to control the center-line wavelength of the output beam to within desired limits. This preferred embodiment also includes PZT load cell 89 (shown in FIG. 4A) which detects high frequency vibrations (caused primarily by the fan and its motor and the discharges) and provides a feedback signal to LNP processor 106 which is programmed to provide a corresponding high frequency control signal to PZT driver 80 to damp down small high frequency wavelength shifts caused by the high frequency vibration. Important features of this preferred embodiment are described in detail below.

Fast Wavemeter

Portion Of Output Beam Sampled

Figure 5:
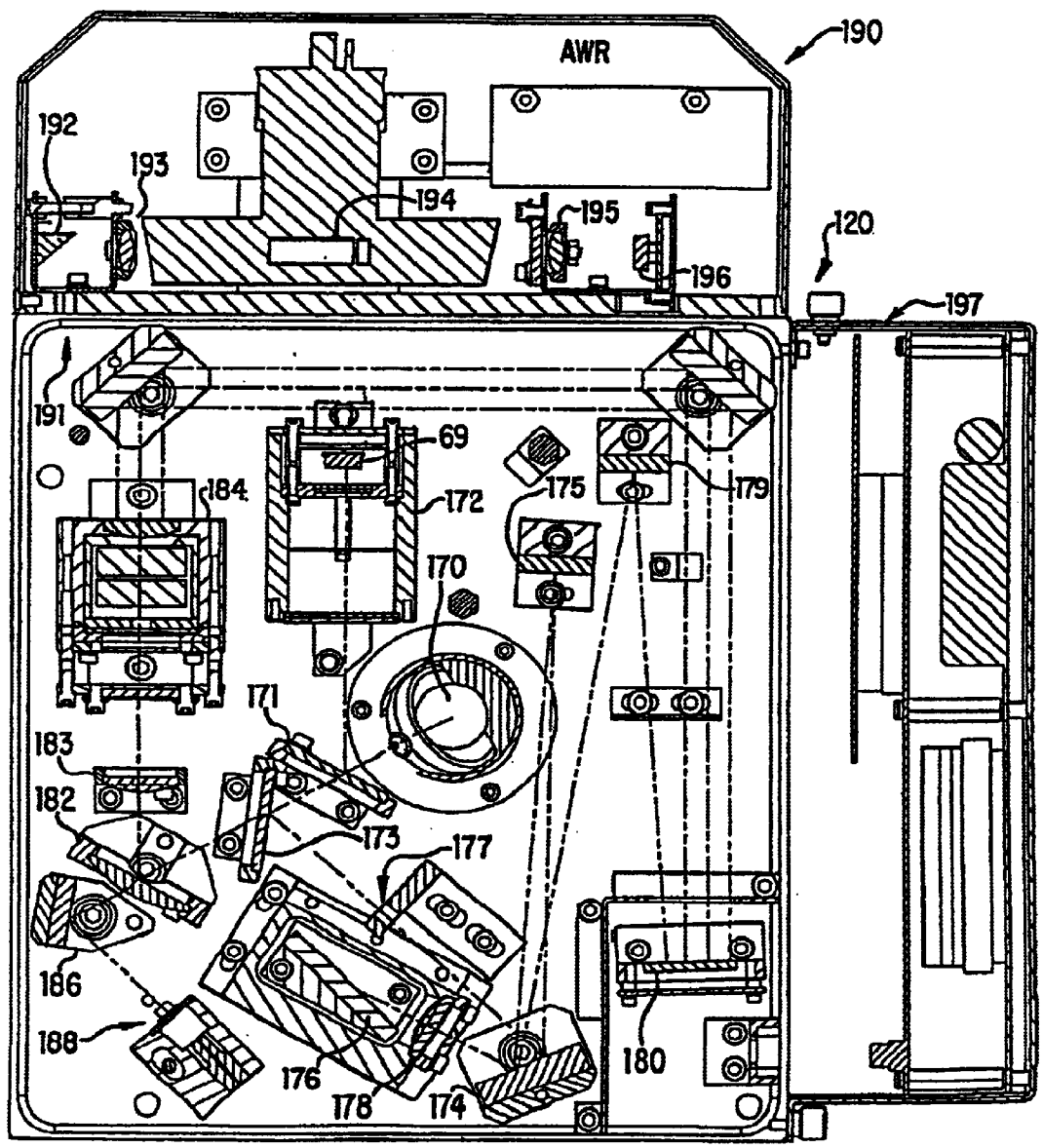
FIG. 5 is a drawing of a wavemeter.
Figure 5A:
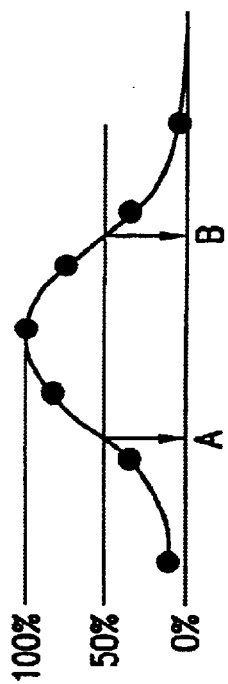
FIGS. 5A and 5B show how wavelength is calculated.

FIG. 5 shows the layouts of a preferred wavemeter unit 120, an absolute wavelength reference calibration unit 190, and a wavemeter processor 197. The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor 102 when specified by a laser operator.

As shown in FIG. 4 and FIG. 5, the laser output beam 42 intersects partially reflecting mirror 170, which passes about 95.5% of the beam energy as the output beam and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses occurring at the rate of 4,000 to 6,000 pulses per second. The pulse energy is about 5 mJ, and the output of detector 69 is fed to a computer controller which uses a special algorithm to adjust the laser charging voltage to precisely control the pulse energy of future pulses based on stored pulse energy data in order to control the energy of individual pulses and the integrated energy in groups of pulses, called "pulse windows". (A pulse window is typically a series of pulses usually within a burst of pulses. For example, a pulse window may be 60 consecutive pulses. A sliding window is a pulse window of a specified number of pulses that slides to include the most recent pulse.)

Linear Photo Diode Array

Figure 6:
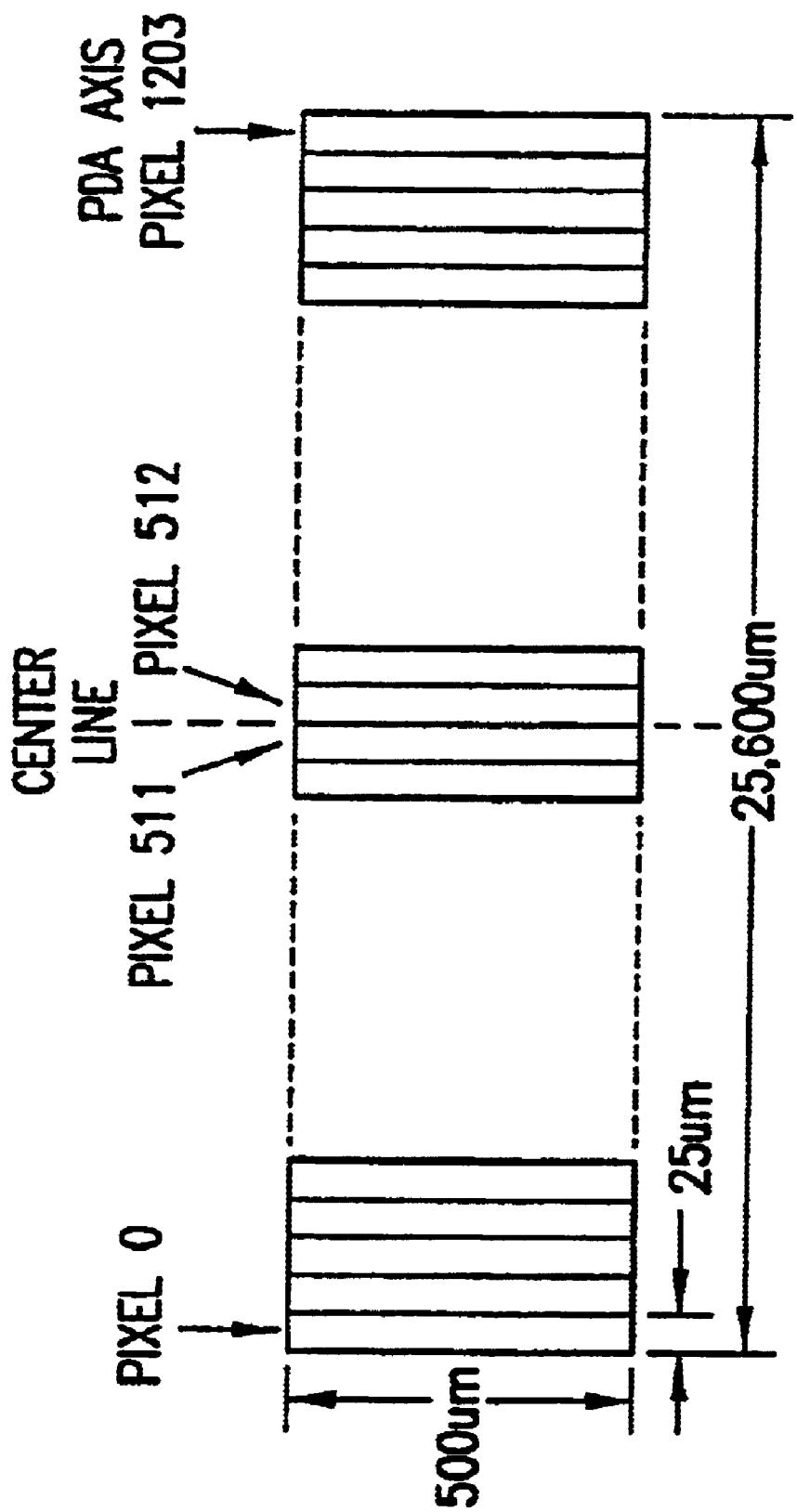
FIG. 6 is a drawing depicting the surface of a photo diode array.

The photo sensitive surface of linear photo diode array 180 is depicted in detail in FIG. 6. The array is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long.

Photo diode arrays such as this are available from several sources. A preferred supplier is Hamamatsu. In a preferred embodiment, Applicants use a Model S3903-1024Q which can be read at the rate of up to $4 \times 10^6$ pixels/sec on a FIFO basis in which complete 1024 pixel scans can be read at rates of 4,000 Hz or greater. The PDA is designed for $2 \times 10^6$ pixel/sec operation but Applicants have found that it can be over-clocked to run much faster, i.e., up to $4 \times 10^6$ pixel/sec. For pulse rates greater than 4,000 Hz, Applicants can use the same PDA but only a fraction (such as 60% of the pixels are normally read on each scan).

Coarse Wavelength Measurement

Figure 6A:
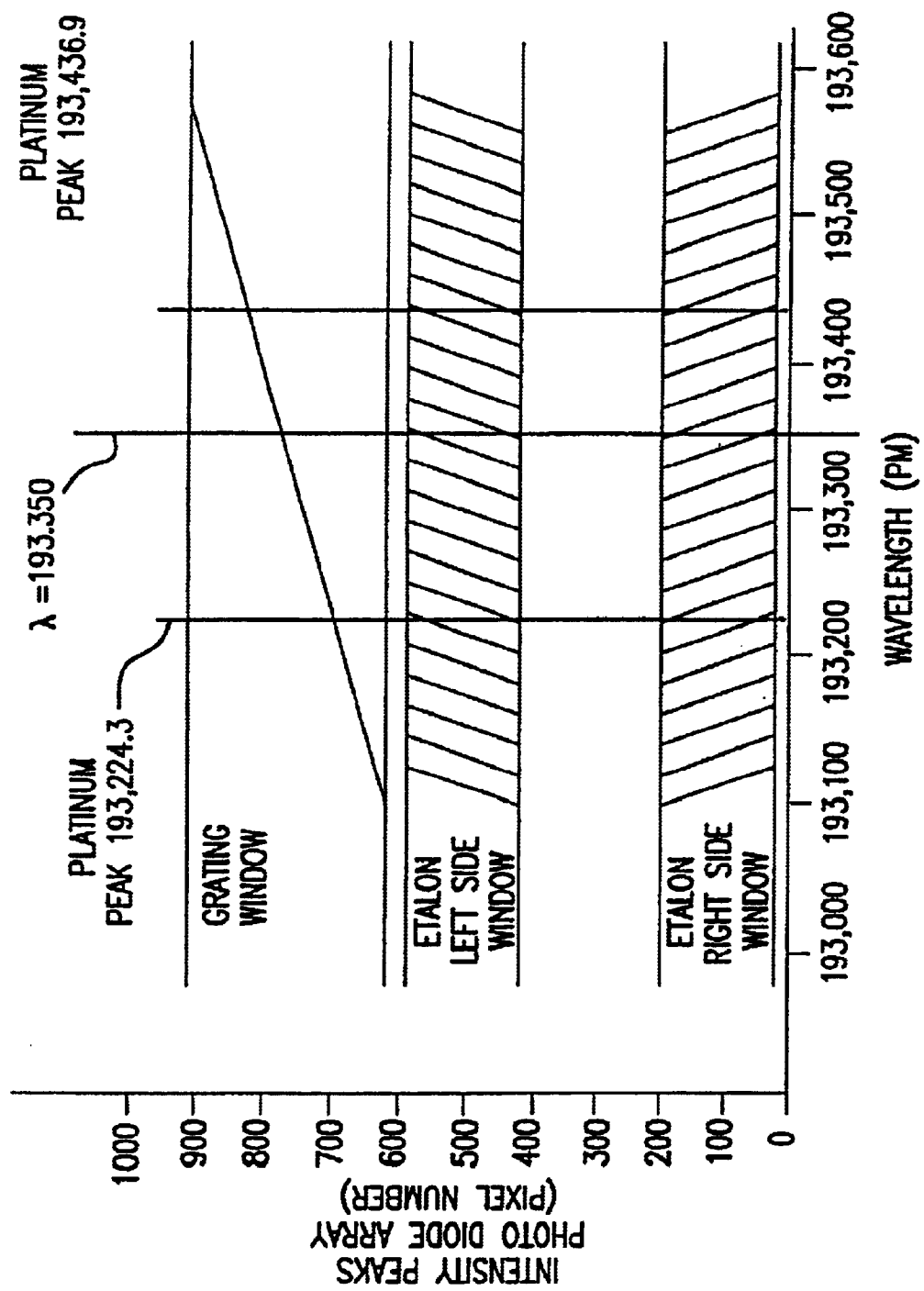
FIG. 6A shows how grating and etalon images appear on the surface of the FIG. 6 photo diode array.

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174 and then is reflected from mirror 179 and focused onto the left side of 1024-pixel linear photo diode array 180 in the region of pixel 600 to pixel 950 as shown in the upper part of FIG. 6A (Pixels 0–599 are reserved for fine wavelength measurement and bandwidth.) The spatial position of the beam on the photo diode array is a coarse measure of the relative nominal wavelength of the output beam. For example, as shown in FIG. 6A, light in the wavelength range of about 193.350 pm would be focused on pixel 750 and its neighbors.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 191{,}625 \text{ pm}$$

where P=coarse image central positions.

Alternatively, additional precision could be added if desired by adding a second order term such as "+( ) $P^2$.

Fine Wavelength Measurement

An etalon spectrometer is provided for fine wavelength and bandwidth measurement. About 95% of the beam which passes through mirror 173 as shown in FIG. 5 is reflected off mirror 182 through lens 183 onto a diffuser at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 5. The spectrometer must measure wavelength and bandwidth substantially in real time. Because the laser repetition rate may be 4,000 Hz to 6,000 Hz, it is necessary to use algorithms which are reasonably accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 5B:
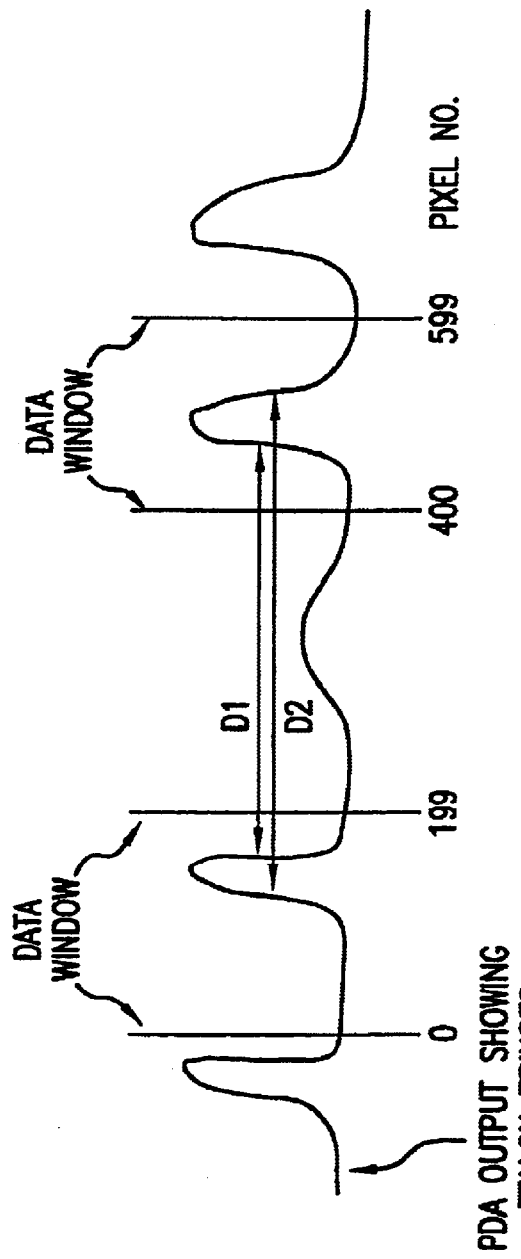

The specific details of a preferred algorithm used in this preferred embodiment will now be described. FIG. 5B is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 5B. The data windows are located so that the fringe nearest the central peak is normally used for the analysis. However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window.

Figure 7:
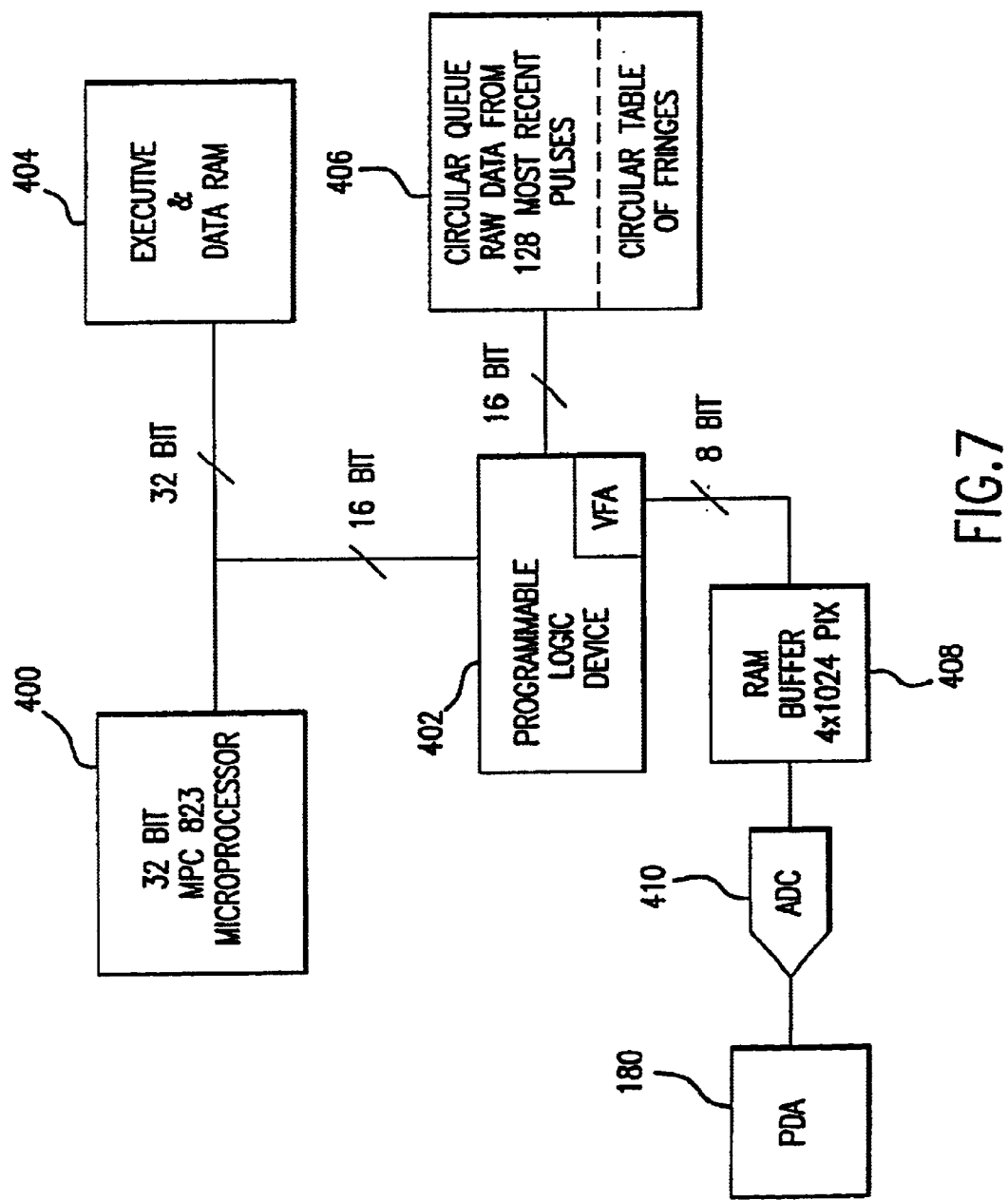
FIG. 7 shows the arrangement of wavelength calculating hardware.

For very fast computation of bandwidth for each pulse at repetition rates up to the range of 4,000 Hz to 6,000 Hz a preferred embodiment uses the hardware identified in FIG. 7. The hardware includes a microprocessor 400, Model MPC 823 supplied by Motorola with offices in Phoenix, Ariz.; a programmable logic device 402, Model EP 6016QC240 supplied by Altera with offices in San Jose, Calif.; an executive and data memory bank 404; a special very fast RAM 406 for temporary storage of photodiode array data in table form; a third 4×1024 pixel RAM memory bank 408 operating as a memory buffer; and an analog to digital converter 410.

As explained in U.S. Pat. No. 5,025,446 and U.S. Pat. No. 5,978,394, prior art devices were required to analyze a large mass of PDA data pixel intensity data representing interference fringes produced by etalon 184 and photodiode array 180 in order to determine center line wavelength and bandwidth. This was a relatively time consuming process even with a computer processor because about 400 pixel intensity values had to be analyzed to look for and describe the etalon fringes for each calculation of wavelength and bandwidth. A preferred embodiment of the present invention greatly speeds up this process by providing a processor for finding the important fringes, which operates in parallel with the processor calculating the wavelength information.

The basic technique is to use programmable logic device 402 as shown in FIG. 7 to continuously produce a fringe data table from the PDA pixel data as the pixel data are produced. Logic device 402 also identifies which of the sets of fringe data represent fringe data of interest. Then when a calculation of center wavelength and bandwidth are needed, microprocessor merely picks up the data from the identified pixels of interest and calculates the needed values of center wavelength and bandwidth. This process reduces the calculation time for microprocessor by about a factor of about 10. Specific steps in the process of calculating center wavelength and bandwidth are as follows:

1) With PDA 180 clocked to operate at 2.5 MHz, PDA 180 is directed by processor 400 to collect data from pixels 1 to 600 at a scan rate of 4,000 Hz and to read pixels 1 to 1028 at a rate of 100 Hz.
2) The analog pixel intensity data produced by PDA 180 is converted from analog intensity values into digital 8 bit values (0 to 255) by analog to digital converter 410 and the digital data are stored temporarily in RAM buffer 408 as 8 bit values representing intensity at each pixel of photodiode array 180.
3) Programmable logic device 402 analyzes the data passing out of RAM buffer 408 continuously on an almost real time basis looking for fringes, stores all the data in RAM memory 406, identifies all fringes for each pulse, produces a table of fringes for each pulse and stores the tables in RAM 406, and identifies for further analysis one best set of two fringes for each pulse. The technique used by logic device 402 is as follows:
   A) PLD 402 analyzes each pixel value coming through buffer 408 to determine if it exceeds an intensity threshold while keeping track of the minimum pixel intensity value. If the threshold is exceeded this is an indication that a fringe peak is coming. The PLD identifies the first pixel above threshold as the "rising edge" pixel number and saves the minimum pixel value of the pixels preceding the "rising edge" pixel. The intensity value of this pixel is identified as the "minimum" of the fringe.
   B) PLD 402 then monitors subsequent pixel intensity values to search for the peak of the fringe. It does this by keeping track of the highest intensity value until the intensity drops below the threshold intensity.
   C) When a pixel having a value below threshold is found, the PLD identifies it as the falling edge pixel number and saves the maximum value. The PLD then calculates the "width" of the fringe by subtracting the rising edge pixel number from the falling edge pixel number.
   D) The four values of rising edge pixel number, maximum fringe intensity, minimum fringe intensity and width of the fringe are stored in the circular table of fringes section of RAM memory bank 406. Data representing up to 15 fringes can be stored for each pulse although most pulses only produce 2 to 5 fringes in the two windows.
   E) PLD 402 also is programmed to identify with respect to each pulse the "best" two fringes for each pulse. It does this by identifying the last fringe completely within the 0 to 199 window and the first fringe completely within the 400 to 599 window.

The total time required after a pulse for (1) the collection of the pixel data, and (2) the formation of the circular table of fringes for the pulse is only about 200 micro seconds. The principal time saving advantage of this technique is that the search for fringes is occurring as the fringe data is being read out, digitized and stored. Once the two best fringes are identified for a particular pulse, microprocessor 400 secures the raw pixel data in the region of the two fringes from RAM memory bank 406 and calculates from that data the bandwidth and center wavelength. The calculation is as follows:

Typical shape of the etalon fringes are shown in FIG. 18B. Based on the prior work of PLD 402 the fringe having a maximum at about pixel 180 and the fringe having a maximum at about pixel 450 will be identified to microprocessor 400. The pixel data surrounding these two maxima are analyzed by microprocessor 400 to define the shape and location of the fringe. This is done as follows:
   A) A half maximum value is determined by subtracting the fringe minimum from the fringe maximum dividing the difference by 2 and adding the result to the fringe minimum. For each rising edge and each falling edge of the two fringes the two pixels having values of closest above and closest below the half maximum value. Microprocessor then extrapolates between the two pixel values in each case to define the end points of D1 and D2 as shown in FIG. 18B with a precision of $\frac{1}{32}$ pixel. From these values the inner diameter D1 and the outer diameter D2 of the circular fringe are determined.

Fine Wavelength Calculation

The fine wavelength calculation is made using the course wavelength measured value and the measured values of D1 and D2.

The basic equation for wavelength is:

$$\lambda = (2*n*d/m) \cos(R/f) \qquad (1)$$

where
   $\lambda$ is the wavelength, in picometers,
   n is the internal index of refraction of the etalon, about 1.0003,
   d is the etalon spacing, about 1542 um for KrF lasers and about 934 $\mu$m for ArF lasers, controlled to +/−1 um,
   m is the order, the integral number of wavelengths at the fringe peak, about 12440, R is the fringe radius, 130 to 280 PDA pixels, a pixel being 25 microns, f is the focal distance from the lens to the PDA plane.

Expanding the cos term and discarding high order terms that are negligibly small yields:

$$\lambda = (2n*d/m)[1-(\tfrac{1}{2})(R/f)^2] \quad (2)$$

Restating the equation in terms of diameter D=2*R yields:

$$\lambda = (2*n*d/m)[1-(\tfrac{1}{8})(D/f)^2] \quad (3)$$

The wavemeter's principal task is to calculate λ from D. This requires knowing f, n, d and m. Since n and d are both intrinsic to the etalon we combine them into a single calibration constant named ND. We consider f to be another calibration constant named FD with units of pixels to match the units of D for a pure ratio. The integer order m varies depending on the wavelength and which fringe pair we choose. m is determined using the coarse fringe wavelength, which is sufficiently accurate for the purpose.

A couple of nice things about these equations is that all the big numbers are positive values. The WCM's microcontroller is capable of calculating this while maintaining nearly 32 bits of precision. We refer to the bracketed terms as FRAC.

$$FRAC=[1-(\tfrac{1}{8})(D/FD)^2] \quad (4)$$

Internally FRAC is represented as an unsigned 32 bit value with its radix point to the left of the most significant bit. FRAC is always just slightly less than one, so we get maximal precision there. FRAC ranges from [1−120E−6] to [1−25E−6] for D range of {560~260} pixels.

When the ND calibration is entered, the wavemeter calculates an internal unsigned 64 bit value named 2ND=2*ND with internal wavelength units of femtometers (fm)=10^−15 meter=0.001 pm. Internally we represent the wavelength λ as FWL for the fine wavelength, also in fm units. Restating the equation in terms of these variables:

$$FWL=FRAC*2ND/m \quad (5)$$

The arithmetic handles the radix point shift in FRAC yielding FWL in fm. We solve for m by shuffling the equation and plugging in the known coarse wavelength named CWL, also in fm units:

$$m=\text{nearest integer } (FRAC*2ND/CWL) \quad (6)$$

Taking the nearest integer is equivalent to adding or subtracting FSRs in the old scheme until the nearest fine wavelength to the coarse wavelength was reached. Calculate wavelength by solving equation (4) then equation (6) then equation (5). We calculate WL separately for the inner and outer diameters. The average is the line center wavelength, the difference is the linewidth.

Bandwidth Calculation

The bandwidth of the laser is computed as $(\lambda_2-\lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\epsilon$ is subtracted, which provides sufficient accuracy. Therefore, the bandwidth is:

$$\Delta\lambda = \left(\frac{D_2-D_1}{2}\right) - \Delta\lambda\epsilon$$

$\Delta\lambda\epsilon$ depends on both the etalon specifications and the true laser bandwidth. It typically lies in the range of 0.1–1 pm for the application described here.

Feedback Control of Pulse Energy

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein.

Control of Center Line Wavelength

In preferred embodiments of the present invention, several techniques are combined to control the center line wavelength and to reduce center line error (CLE). All of the techniques make use of piezoelectric driver 80 to control the pivot position of mirror 14. The techniques include (1) fast feedback control, (2) vibration detection and cancellation, (3) active damping and (4) fast transient inversion. The techniques are described in detail below.

Fast Feedback Control of Wavelength

Figure 4A:
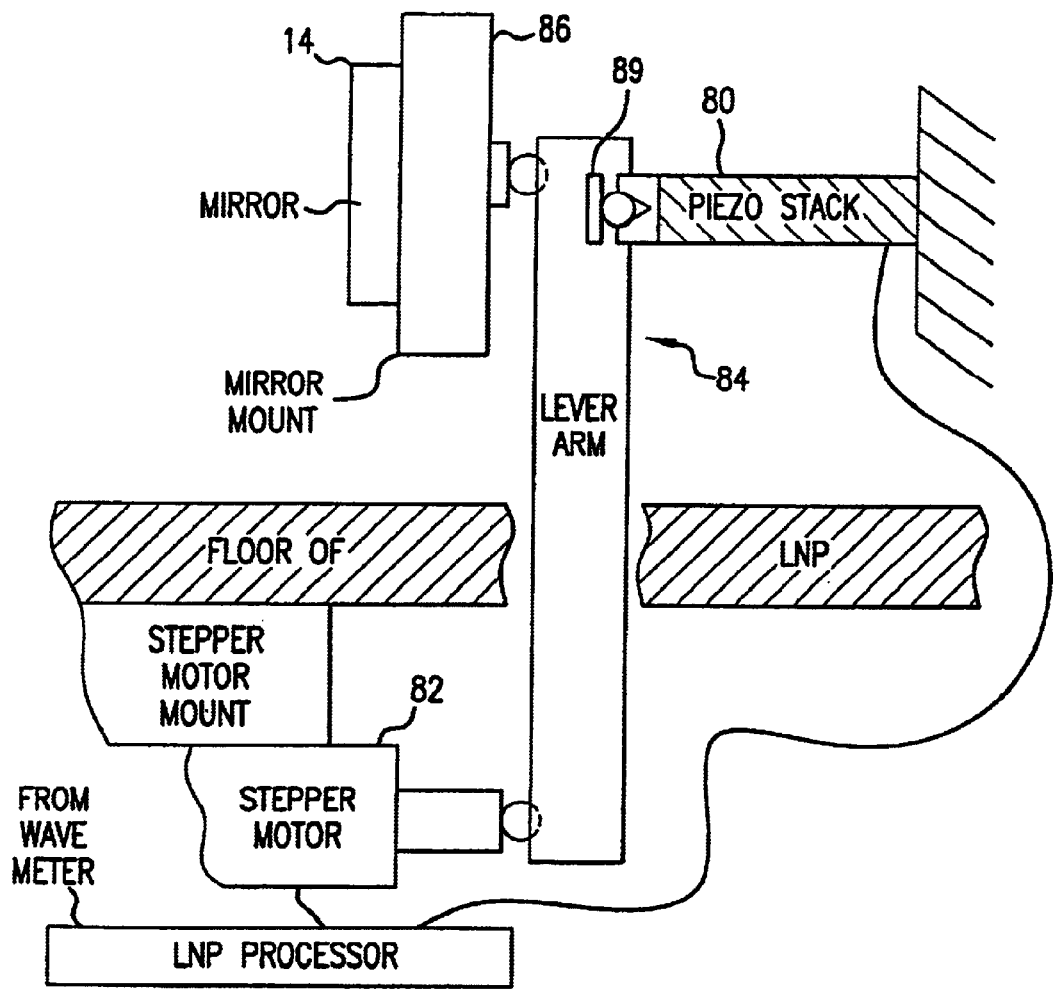
Figure 4B:
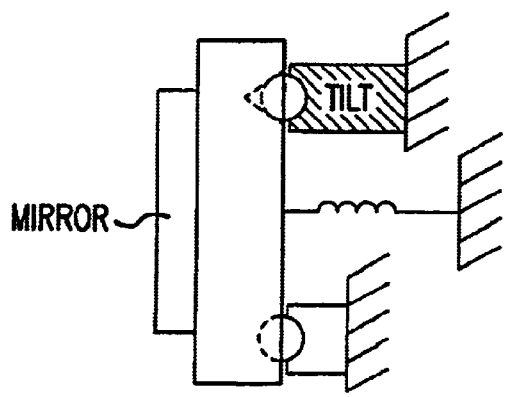

Wavelength of the laser may be controlled in a feedback arrangement using measured values of wavelengths and techniques known in the prior art such as those techniques described in U.S. Pat. No. 5,978,394, Wavelength System for an Excimer Laser also incorporated herein by reference. Applicants have developed techniques for wavelength tuning which utilize a piezoelectric driver to provide extremely fast movement of tuning mirror. Some of these techniques are described in U.S. patent application Ser. No. 608,543, Bandwidth Control Technique for a Laser, filed Jun. 30, 2000 which is incorporated herein by reference. FIGS. 4A and 4B are extracted from that application and show the principal elements of this technique. A piezoelectric stack is used for very fast mirror adjustment and larger slower adjustments are provided by a prior art stepper motor operating a lever arm. The piezoelectric stack adjusts the position of the fulcrum of the lever arm.

Fast Mirror Adjustment

FIGS. 4, 4A and 4B show an arrangement permitting very fast adjustment of mirror 14. This embodiment is a major speed up as compared to the stepper motor drive system described above but not quite fast enough for pulse-to-pulse adjustment. As indicated above, earlier methods of mirror positioning required about 7 ms to move mirror 14, making pulse-to-pulse wavelength correction at 2000 Hz out of the question. In that earlier technique, a lever arm pivoted about a pivot axis to produce a 1 to 26.5 reduction in the mirror movement compared to the stepper position movement. The prior art stepper has a total travel of ½ inch (12.7 mm) and 6000 steps so that each step is a distance of about 2 microns. With the 1–26.5 reduction, one step moves the mirror about 75 nm which typically changes the wavelength of the laser wavelength about 0.1 pm. In the fast acting technique shown in FIG. 4A, a piezo stack 80 has been added at the pivot position of the lever arm. A preferred piezo stack is Model P-840.10 supplied by Physik Instrumente GmbH with offices in Waldbronn, Germany.

Figure 8:
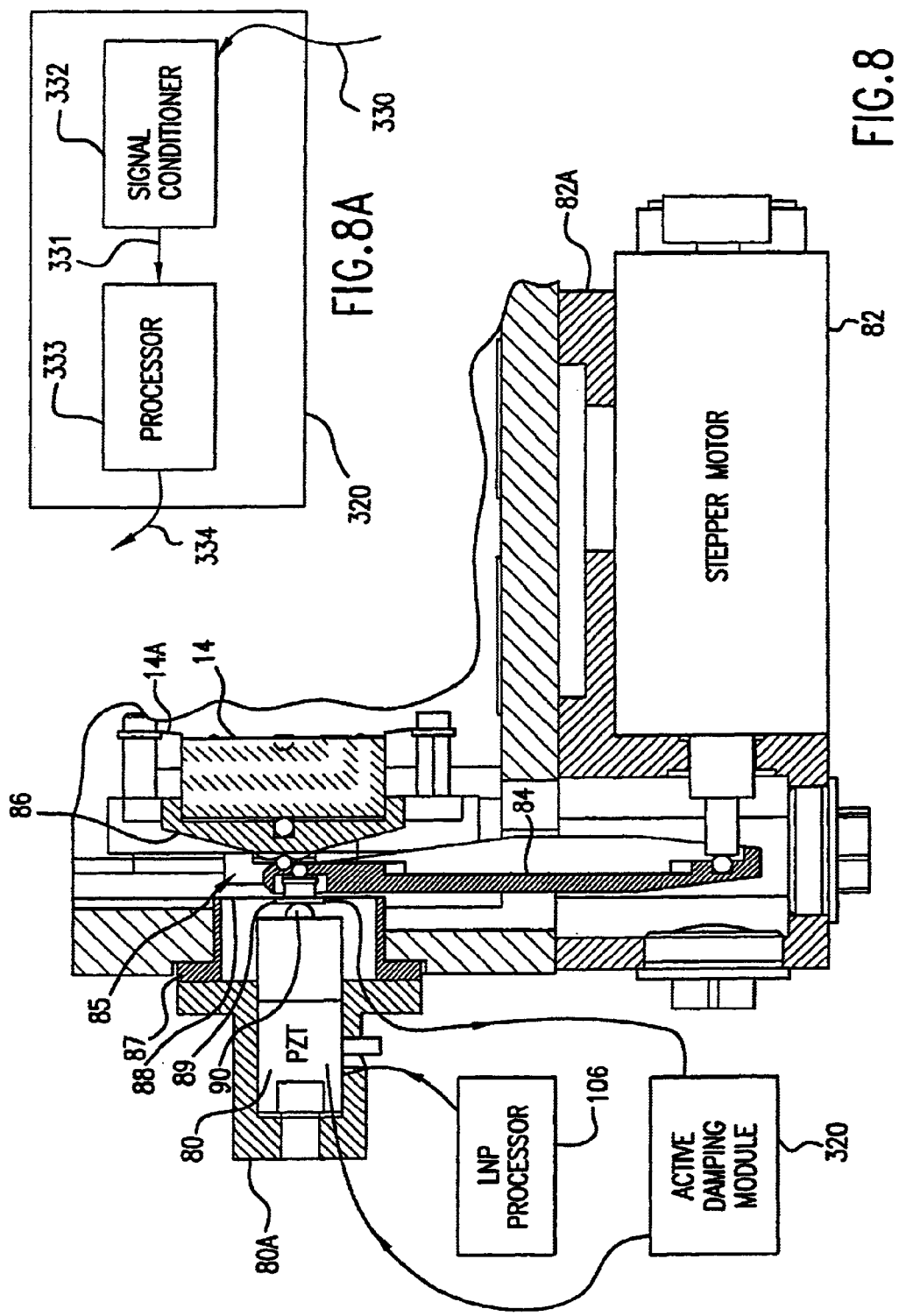

FIG. 8 is a drawing showing detail features of this preferred embodiment of the present invention. Large changes in the position of mirror 14 are produced by stepper motor through a 26.5 to 1 lever arm 84. In this case a diamond pad at the end of piezoelectric drive 80 is provided to a contact spherical tooling ball at the fulcrum of lever arm 84. The contact between the top of lever arm 84 and mirror mount 86 is provided with a dow pin on the lever arm and four spherical ball bearings mounted (portions of only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in mirror mount 86 with a three-point mount using three aluminum spheres, only one of which is shown in FIG. 8. Three springs 14A apply the compressive force to hold the mirror against the spheres. This embodiment includes a bellows 87 with drum flexure 88 to isolate the piezoelectric drive from the environment inside the LNP. This isolation prevents UV damage to the piezoelectric element and avoid possible contamination caused by out gassing from the piezoelectric materials. This embodiment also includes load cell 89 mounted near the top of PZT stack 80 to provide a feedback high frequency vibration signal as discussed in more detail below.

This stack will produce linear adjustment of about 3.0 microns with a drive voltage change of 20 volts. This range is equivalent to about ±20 steps (40 absolute steps) of the stepper motor.

Figure 11:
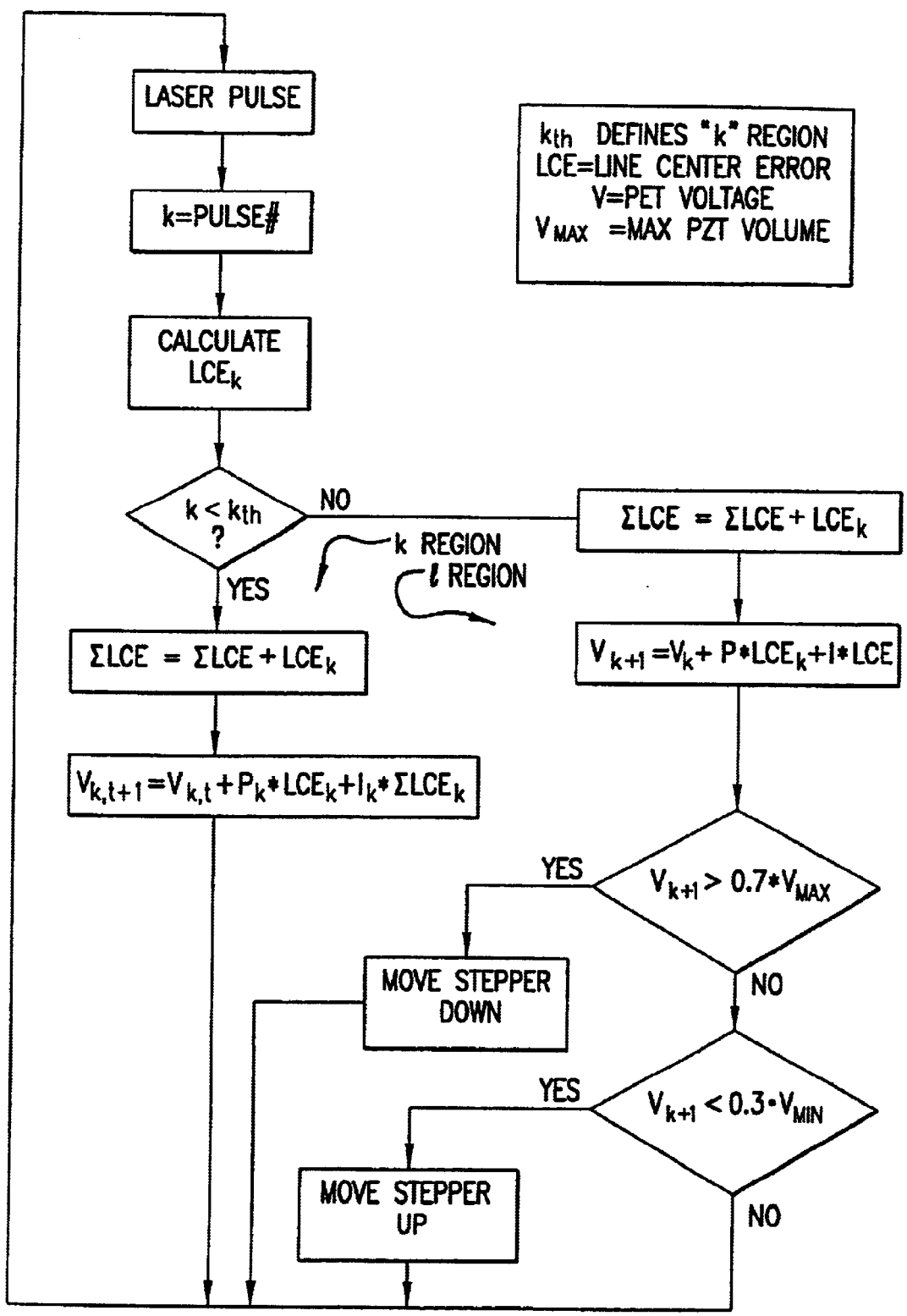
FIG. 11 shows a feedforward control algorithm flow chart.

The stack responds to a control signal within less than 0.1 milliseconds and the system can respond to updated signals at a frequency of 4000 Hz (0.25 millisecond intervals). Preferably the wavemeter will be fast enough to provide a feedback signal prior to each pulse based on data from the prior pulse. Alternatively, feedback data could be based (not on the previous pulse) on one or more pulses prior to the previous pulse to allow plenty of time for the wavelength calculation at 4 kHz even the third pulse behind the current pulse provides a factor of 7 improvement over the prior art design which had a 7 millisecond latency. Therefore, much faster feedback control can be provided. An example of a simple feedback control algorithm is described in FIG. 9. In this algorithm the wavelength is measured for each pulse and an average wavelength for the last four and last two pulses is calculated. If either of the average deviate from the target wavelength by less than 0.02 pm, no adjustment is made. If both deviate more than 0.02 pm from the target, an adjustment is made to the mirror assembly by piezoelectric stack 80 to provide a wavelength correction. Which of the two averages is used is determined by how much time had elapsed since the last adjustment. The piezoelectric stack is maintained within its control range by stepping the stepper motor as the stack approaches 30 and 70 percent of its range (alternatively other ranges such as 45 and 55 percent could be used instead of the 30 and 70 percent range values). Since the stepper motor requires about 7 ms to complete a step, the algorithm may make several piezo adjustments during a stepper motor step. Alternatively, instead of the FIG. 9 algorithm a traditional proportional algorithm could be used as described for the "L" region in FIG. 11. The FIG. 11 algorithm is described in this section entitled "Fast Transient Inversion". Preferably, however, when operating in a "burst" mode with a laser experiencing a repeating early CLE transient (such as the 30 pulse transient shown in FIG. 1) a combination of first transient inversion based on historical burst patterns plus feedback control typically provides best results.

Vibration Control

This preferred embodiment provides feedback control of center line wavelength shifts due to low amplitude, high frequency vibration-type disturbances of laser equipment (especially the optical components) due primarily to the rotating fan and its motor driver and to the electric discharges. In this preferred embodiment, piezoelectric load cell 89 (approximately 0.25 inch diameter×0.02 inch) is located near the top of PZT stack 80 as shown in FIG. 8. The load cell preferably is packaged as described in U.S. Pat. No. 5,656,882 (hereby incorporated by reference herein). The load cell is located between a spherical contact 90 and drum feature 88.

In this embodiment, electrical connection to the two major sides of the piezoceramic sensor is achieved through insulated copper traces. Alternatively, a bare piece of piezoceramic material could be utilized as the load cell along with some means of electrical connection (e.g. 30 AWG copper wire) to the electrically conductive surfaces of the piezoceramic material. The load sensor is utilized to measure the forces applied to the $R_{max}$ holder through the spherical contact 90, the drum flexure 88, and the stepper motor lever 84 and the piezoceramic stack. These forces include forces resulting from the vibration-type disturbances referred to above.

PZT load cell 89 produces 10's of volts in response to forces applied by the PZT stack 80 or in response to vibrations in the Rmax holder 84 or connecting structures. The signal levels produced by the PZT load cell 89 are generally proportional to the forces or vibrations. The sensor can easily measure forces or vibrations at a frequency in excess of approximately 100 kHz. The sensor can detect forces as small as 0.01 Newton (0.00225 pound force).

Active Damping

In the FIG. 8 embodiment the load cell 89 is used in conjunction with an active damping module 320 and the PZT stack 80 to reduce structural vibrations to improve line center stability. More specifically, active damping is applied to reduce the center wavelength error (typically computed based on wavelength data collected from a 30 pulse "window" of data, the average of which is called a "30 pulse moving average") and a 30 pulse moving standard deviations are calculated. In FIG. 8A, the load sensor 89 emits an electrical charge 330 that is proportional to the applied load or vibration. This charge is fed into a charge amplifier circuit (with signal conditioner) 332 used to condition the signal by converting it in to a voltage proportional to the charge. The details of the design of such charge amplifier circuits can be found in a PCB Piezotronics Inc. technical support document entitled "Introduction to Signal Conditioning for ICP and Charge Piezoelectric Sensors" or similar instruction manuals dealing with vibration sensor design and implementation.

Voltage signal 331 is fed into processor 333 which in this case is Model SBC67 supplied by Innovative Integration Inc. with offices in Simi Valley, Calif. This processor is a high performance stand-alone digital signal processor single board computer featuring analog input and output capability. The voltage signal 331 is fed into an analog input. This analog input is then converted to a digital signal that is used by the processor with an appropriate algorithm (described below) to create a digital output signal which is then converted to an analog output signal 334. This output signal 334 is then summed (electrically) with the center wavelength control signal coming from the LNP processor 106 and applied as a command signal to the PZT stack.

A software filter (feedback control algorithm) may be designed using the standard Linear Quadratic Gaussian approach, ensuring that the piezoelectric stack actuator control voltages do not exceed the stack actuator device or amplifier limits. Actuator voltages in the closed feedback loop are calculated to oppose the load sensor signal 89 associated with vibration in the structure. Several types of control filter are applicable to active damping architectures. In the present case, with a single actuator/sensor pair and a few well-spaced (in frequency) modes to be controlled, narrowband filters provide the correct combination of gain and phase at the natural frequency of interest, while adding little or no feedback gain elsewhere, enhancing stability. Such a control approach has been called Positive Position Feedback. The control approaches are discussed at length by Fanson, J. L., and Caughey, T. K., "Positive Position Feedback Control for Large Space Structures," *AIAA Journal*, Vol. 28, ,pp. 717–724, 1990. These approaches also apply to the problem of force feedback to a position actuator. Control design should be tailored for the specific application. A preferred technique is to create a state-space plant model from transfer function data using a software package such as the Smart ID system identification software package commercially available from Active Control Experts, Inc. with offices in Cambridge, Mass. The filter (or controller) preferably is designed using computer simulation and techniques such as those explained by Fanson (see above) and those provided in *The Control Handbook*, William S. Levine, Editor, CRC Press 1996.

Applicants have conducted studies to determine the source of these disturbances and have determined that the fast components of the wavelength shift are caused by persistent disturbances which appear to be random. Most of these components are caused by the blower. It excites numerous resonances up to 1500 Hz, plus one significant outlier at a much higher frequency. Applicants' tests have shown that the frequencies excited do not shift significantly as a function of blower speed. However, the magnitudes of the disturbances at various frequencies are affected by blower speed.

Modal identification of the laser system was used in conjunction with experimental data to determine what components of the system were vibrating. Modal identification involved the mapping of displacements of different portions of the laser system to determine the general shape of the vibration at a given frequency. Accelerometers, strain gages, PZT strain sensors, and a load cell were used to construct the modal response of the system at various frequencies of interest. The modal response of the system was determined for certain frequencies that were detected (such as 44 Hz, 178 Hz, 590 Hz and 900–1000 Hz). Applicants determined that for the particular laser tested, the 44 Hz mode represented the cantilevered vibration of the LNP and that the 178 Hz vibration was due to the LNP bending and twisting. The 590 Hz mode represents complex motion of the LNP in which opposing portions of the LNP structure vibrate in opposition (breathing motion). This mode is the aliased frequency of a structural mode at 2682 Hz. The cluster of modes in the 900–1000 Hz range represents a set of modes that are aliased down from a cluster of structural modes located between 1100–1200 Hz. A structural mode located in this cluster is a local mode of the steering mirror. The location of this group of modes may vary as a function of the specific design of the mirror assembly.

Applicants determined that about 50% of the center wavelength variance was due to a set of structural resonances between roughly 1100 Hz and 1200 Hz which were randomly excited by the blower in the chamber. In this embodiment, these modes are actively controlled, in the aggregate, by the PZT stack, through feedback of the force measured by load cell 89 in the PZT stack drivetrain operated at a high sample rate of about 20 kHz. This sampling rate is about 20 times faster than the feedback signal available from the wavemeter described above. For purposes of active feedback it is usually desirable to have a feedback sensor signal that can be sampled at a rate of at least approximately 10× higher than the frequency of the mode that is being controlled. Ideally, a higher bandwidth measurement signal that is correlated to the center wavelength of error would be available as the feedback measurement. At this point, the PZT load cell signal is used for feedback.

The PZT load cell is very stiff and it is sensitive enough to meet requirements imposed by the small forces in the system, and provides a high-bandwidth "always on" signal for active damping feedback. The "always on" feature also eliminates any problem with transient controller dynamics at the start of a burst unlike the disturbance rejection control which is accomplished through feedback of light measurements.

As explained above, the feedback control solution implemented consists of the load cell sensor 89 and PZT stack actuator as shown in FIG. 8. This high frequency feedback control system preferably includes pre- and post-amplifiers, designed to obtain sufficiently clean feedback and feedforward signals and designed to convert the control signal synthesized by the processor into the correct actuator signal using techniques as explained in U.S. Pat. No. 5,656,882. The actuators impart forces on the mirror, which work to oppose or counter the disturbances resulting in reduced vibrations caused wavelength shifts.

Actual tests performed by Applicants demonstrated that this feedback vibration control reduced the wavelength error autospectrum by about 20% from 0.037 pm RMS to about 0.029 pm RMS. In addition, actual tests performed by Applicants demonstrated that this feedback vibration control reduced a moving-window standard deviation by about 33% from 0.048 pm to 0.030 pm.

Figure 12:
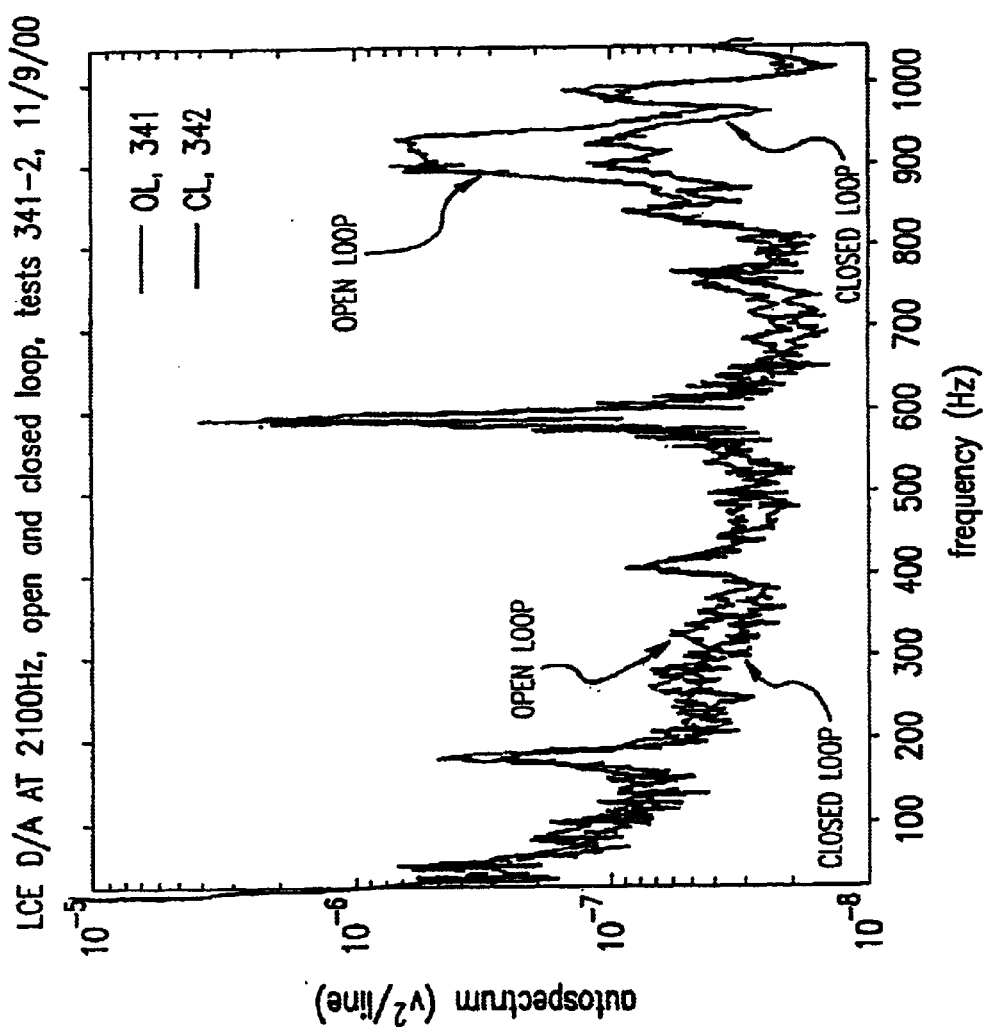
FIG. 12 shows test results.

FIG. 12 and FIGS. 13A and 13B how actual test data from a laser fitted with the FIG. 8 embodiment in which active damping vibration control is implemented. The graph in FIG. 12 is a plot of the wavelength error autospectrum (without the pm/V scale factor included) acquired at a 2100 repetition rate with the active damping control loop open and closed. Graphs 13A1, 2 and 3 and 13B1, 2 and 3 are plots of a moving-window data computed from a number of bursts at 2100 Hz repetition rate. These graphs show line center error, mean wavelength deviation from target and mean standard deviation. The 13A plots are open loop and the 13B plots are closed loop. The charts show a substantial reduction in the standard deviation with the closed loop configuration.

Fast Transient Inversion

Preferred embodiments of the present invention include fast transient inversion (also called feedforward algorithms). These techniques involve algorithms that can be coded by the laser operator based on known burst operation patterns such as those shown in FIG. 1 and FIGS. 2A–D. Alternatively, this algorithm can be adaptive so that the laser control detects burst patterns such as those shown in the above charts and then revises the control parameters to provide adjustment of mirror 14 in anticipation of wavelength shifts in order to prevent or minimize the shifts.

The adaptive feedforward technique involves building a model of the chirp at a given rep rate in software, from data from one or more previous bursts and using the PZT stack to invert the effect of the chirp.

To properly design the chirp inversion, two pieces of information are needed: (1) the pulse response of the PZT stack, and (2) the shape of the chirp. For each repetition rate, deconvolution of the chirp waveform by the pulse response of the PZT stack will yield a sequence of control pulses, which, when applied to the PZT stack (with appropriate sign), will cancel the chirp. This computation can be done off line through a survey of behavior at a set of repetition rates. The data sequences could be saved to tables indexed by pulse number and repetition rate. This table could be referred to during operation and the appropriate set of data can be utilized to provide the adaptive feedforward inversion. It is also possible, and in fact may be preferable, to obtain the chirp shape model in almost real-time using a few bursts of data at the start of operation each time the repetition rate is changed. The chirp shape model, and possibly the PZT pulse response model as well, could then be updated (e.g. adapted) continuously or every N-bursts based on accumulated measured error between model and data.

Test Results

Figure 9:
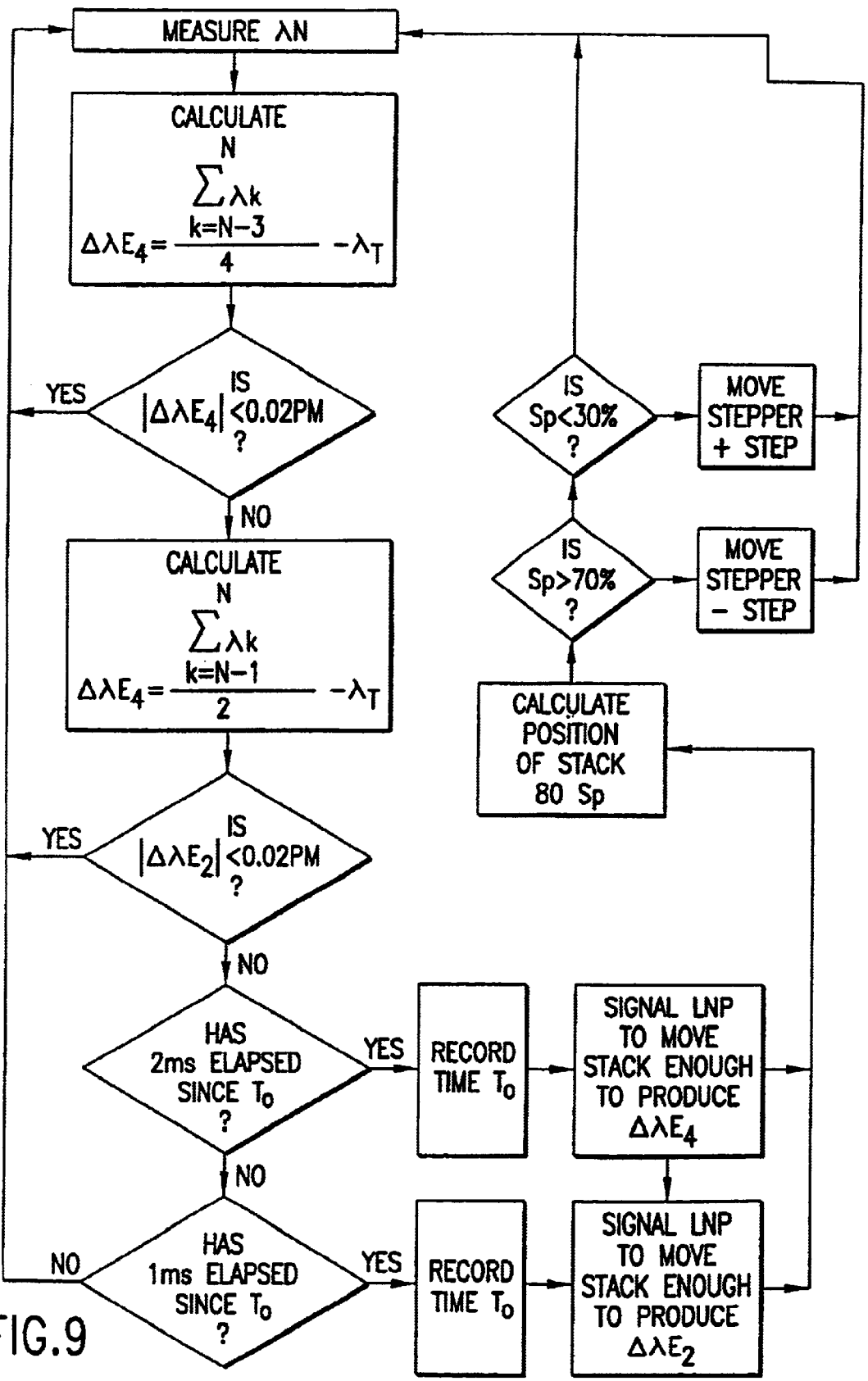
FIG. 9 shows a feedback control algorithm flow chart.
Figure 10:
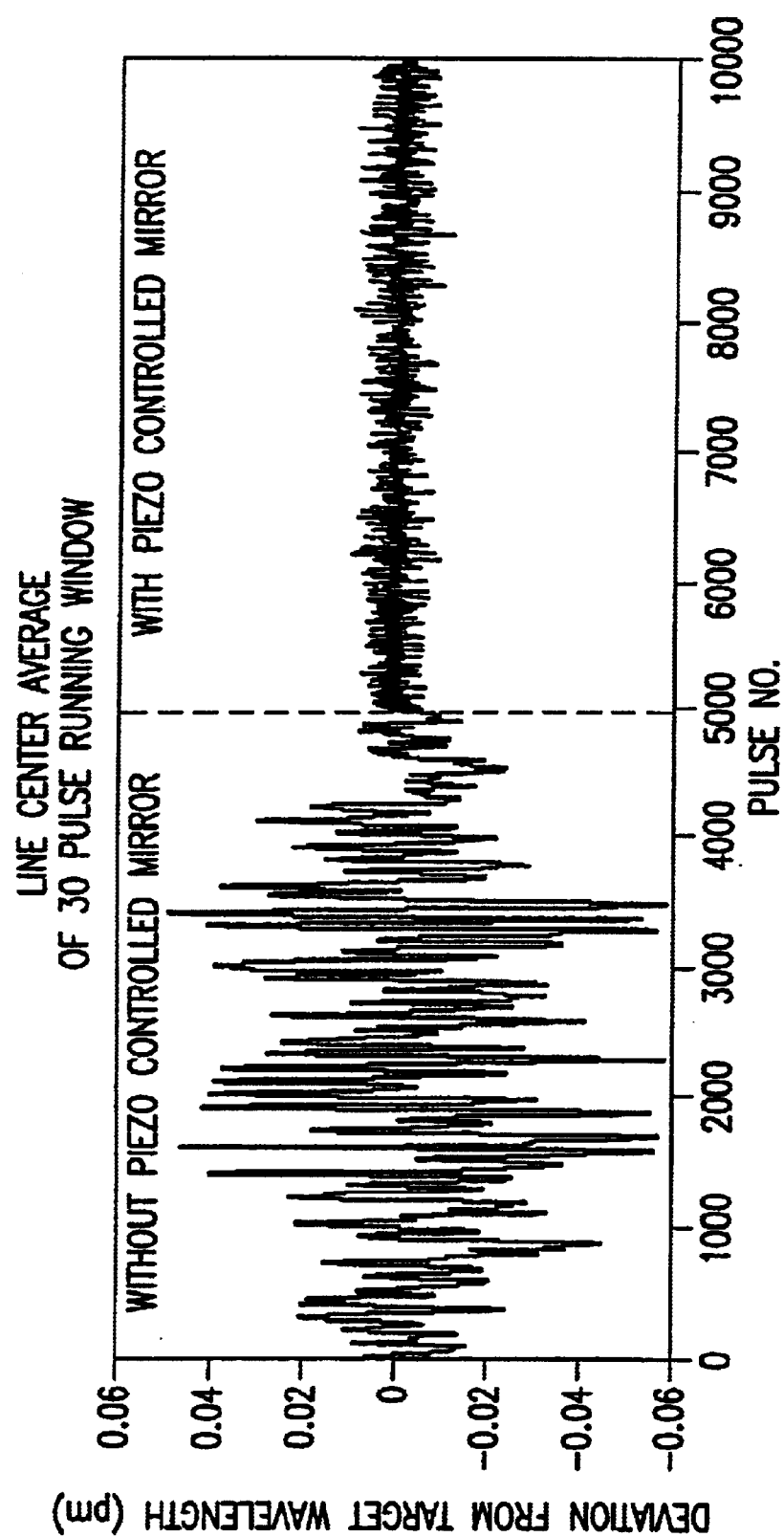
FIG. 10 shows test results.

FIG. 9 shows actual test data from a laser fitted with the FIG. 8 embodiment. The graph is a plot of the deviation from target wavelength of the average of 30 pulse windows. The deviation is reduced from about 0.05 pm to about 0.005 pm.

Derivation of an Adaption Law

Figure 14A:
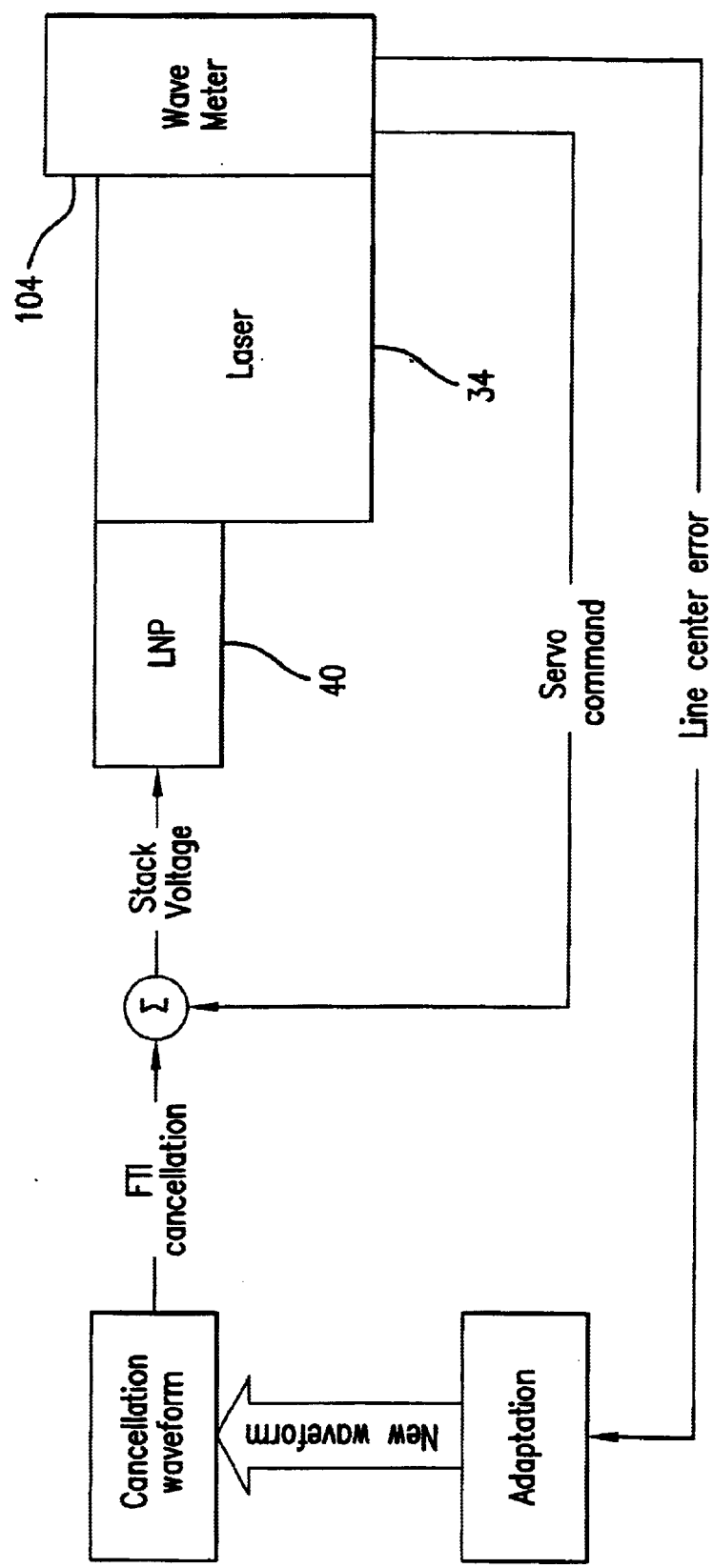
FIGS. 14A, 14B and 14C show features of a preferred embodiment.

Inevitably, there will be variation in the fast transient over the lifetime of a laser. As stated above, this can be accommodated by using an adaptive control strategy. After each burst, the line center error data is analyzed and the correction signal is adjusted to reduce the error for the next burst. In this way, the system continually adapts to time variation. FIG. 14A illustrates the concept. During a burst, a fast transient inversion algorithm outputs a cancellation waveform which is synchronized with laser pulses and is added onto a servo command signal driving piezoelectric driver 80. At the end of the burst, the line center error information is used to compute alterations to the cancellation waveform which will improve the performance on the next burst.

Figure 14B:
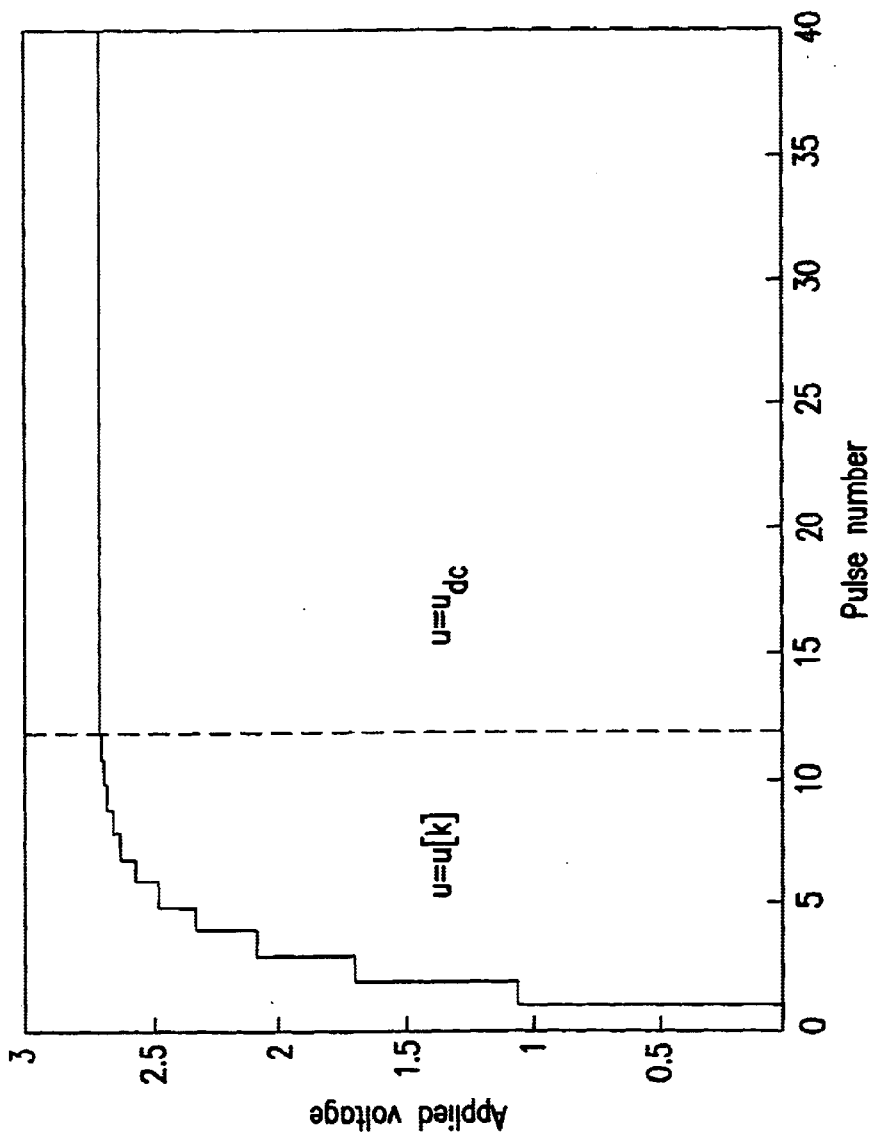

The inversion signal is broken into two components. FIG. 14B shows a typical inversion waveform. The portion of the waveform to the left of the dashed line (u[k]) represents voltage applied for the first few pulses and inverts the transient. The remainder of the signal to the right of the dashed line ($u_{DC}$) cancels a constant offset error observed after the front end chirp transient.

An adaption law is derived in the following manner. In general, the line center error e[t] consists of two terms: the transient, d[t], and the effect of the fast transient inversion, y[t]:

$$e[t] = d[t] - y[t]$$

where t is pulse number.

The effect of the cancellation waveform is given by:

$$y[t] = \sum_{\tau=0}^{t} h[t-\tau]u[\tau] + g[t]u_{DC}$$

where u[t] is the cancellation waveform for the initial portion of the burst, $u_{DC}$ is the constant fast transient inversion signal applied for the rest of the burst, h[t] is the pulse response(due to the PZT stack) of the line center error, and g[t] is the response of the line center error to a unit voltage applied during the interval from the end of the application of u[k] to the end of the burst. Define the objective function to be minimized, J:

$$J = \sum_{t=0}^{N-1} e[t]^2$$

where N is the number of pulses in a burst. The derivative of J with respect to the cancellation waveform, u[t] and $U_{DC}$ is computed as:

$$\frac{\partial J}{\partial u[t]} = 2\sum_{\tau=0}^{N-1} e[\tau]\frac{\partial e[\tau]}{\partial u[t]} \qquad \frac{\partial J}{u_{DC}} = 2\sum_{\tau=0}^{N-1} e[\tau]\frac{\partial e[\tau]}{\partial u_{DC}}$$

$$= -2\sum_{\tau=0}^{N-1} e[\tau]\frac{\partial y[\tau]}{\partial u[t]} \qquad = -2\sum_{\tau=0}^{N-1} e[\tau]\frac{\partial y[\tau]}{\partial u_{DC}}$$

$$= -2\sum_{\tau=t}^{N-1} e[\tau]h[\tau-t] \qquad = -2\sum_{\tau=0}^{N-1} e[\tau]g[\tau]$$

The adaptation law is selected to always take steps in directions which act to reduce the objective function, J:

$$u[t] \rightarrow u[t] + \mu \sum_{\tau=t}^{N-1} e[\tau]h[\tau-t]$$

$$u_{DC} \rightarrow u_{DC} + \mu \sum_{\tau=0}^{N-1} e[\tau]g[\tau]$$

where the adaptation parameter, $\mu$, is adjusted by the designer to trade convergence rate for converged performance. Small values of $\mu$ give the algorithm a slow convergence rate, but improve stability and sensitivity to uncorrelated disturbances. Large values of $\mu$ give faster convergence at the expense of lower stability and poorer noise sensitivity. The quantities, g[t] and h[t] are computed either directly from models of the system, or they are measured by repeatedly applying pulses or steps to the system and averaging the results. It is important to note that g[t] and h[t] must include the effects of low bandwidth servo, which is also applying voltage to the actuator. Data for g[t] and h[t] should be acquired with this servo loop closed.

The acquisition of the adaptation gains, g[t] and h[t] should be adjusted to accommodate variations in dynamics from system to system. In general, this process can be automated and is an integral part of factory and field service calibration.

Figure 14C:
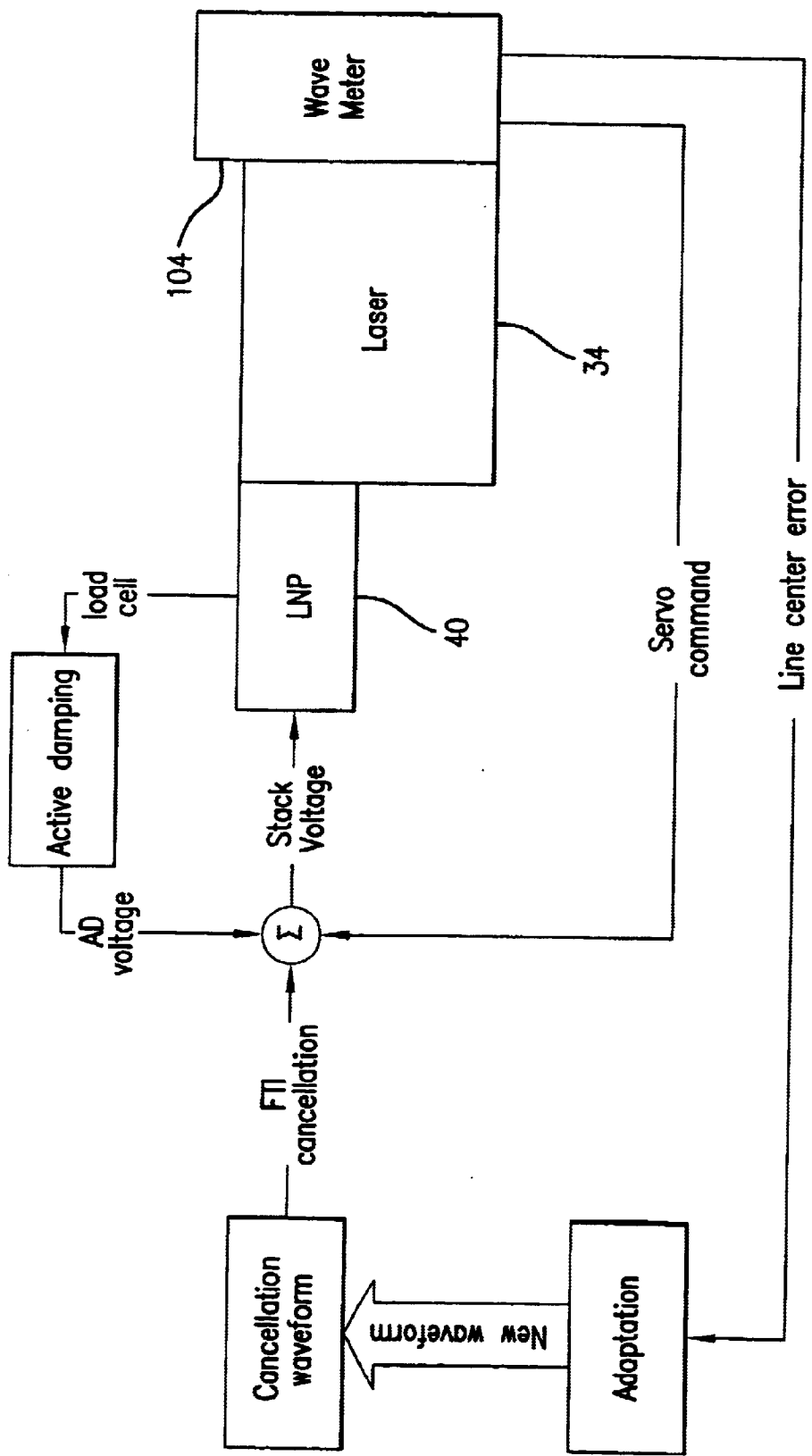

Damping (discussed above) in this case can be easily added by using an appropriate sensor, such as a load cell 89 shown in FIG. 8 which is sensitive to the lightly damped modes in the system. This voltage is fed through a filter to compute an additional voltage which is applied to the stack as shown in FIG. 14C. The dynamics of the filter are designed to apply rate feedback in the frequency ranges where the lightly damped modes have energy.

Inversion Cancellation in a Single Step

It is also possible to calculate a cancellation waveform in a single step. Using the technique described above can be adversely affected by system noise. Therefore, this may require the inversion process to be slowed down somewhat to maintain stability. By calculating the cancellation waveform in a single step can avoid the noise problem and permit the inversion to converge more quickly enhancing performance.

The line center error results in a combination of the front end chirp and other causes which we call noise. In this embodiment, we correct for both at the same time. We determine the chirp portion of the error as described above and we estimate that noise portion of the error by monitoring load cell 89. With both of these inputs a drive voltage is calculated for each pulse to minimize the line center error. The solution is described mathematically below. It is calculated as above by defining an objective function to be minimized, J, taking a partial derivative of it with respect to the PZT drive voltage u and solving for u. As before, the error between the chirp signal to be cancelled, d, and the signal which results from applying a control voltage, u, to the actuator, is given by:

$$e = d - Hu$$

where H is the measured impulse response of the system. The quadratic cost of this error, which we seek to minimize, is:

$$J = (d-HU)^T(d-Hu) + \rho u^T u$$

where the $2^{nd}$ term on the right hand side of the equation is an extra weighting term added to penalize control effort and enhance numerical conditioning of the algorithm.

Expanding the previous expression and taking the derivative with respect to u gives:

$$\frac{\partial J}{\partial u} = -2H^T d + 2(H^T H + \rho I)u = 0$$

Solving for the control signal gives:

$$u = (H^T H + \rho I)^{-1} H^T d$$

The scalar term $\rho$ is chosen to improve the numerical conditioning of the inversion that must be performed in the previous equation. It can be shown that the seemingly more straightforward inverse solution $u = H^{-1} d$ does not produce satisfactory results due to noisy estimates of both H and d, and can sometimes result in singular solutions. Also, the underlying process is non-linear, and the use of this more involved inversion technique parallels that used by the previously described adaptation algorithm. Used in combination, this direct inversion provides an initial guess of the cancellation signal that will then require far fewer adaptation steps to achieve the true "best" cancellation waveform.

Adaptive Feed Forward for Periodic Disturbances

As explained above, the excimer lasers that are the subjection of this application include a wave meter which measures the wavelength of light emitting from the laser on a pulse by pulse basis. This measured wavelength is subtracted from the desired set point to produce a line center error. The line center error is processed by a controller such as that shown at 106 in FIG. 4 which produces a voltage signal which is amplified and used to drive a PZT stack 80 in the line narrowing package 40 of the laser. The stack moves optics within the LNM which are designed to directly control the wavelength of light issuing from the laser.

The Nyquist frequency associated with pulse repetition rate is half the repetition rate which for a 4000 Hz laser would be 2000 Hz. Typical bandwidths for the PZT controller 106 are on the order of 10% of this 2000 Hz Nyquist frequency (i.e., $\frac{1}{20}^{th}$ the pulse repetition rate or about 200 Hz). Any disturbances occurring faster than this will not be controlled and will appear in the line center error. One such source of high frequency errors is the acoustic disturbance caused by the blower used to circulate gas through the laser chamber. This blower has a number of blades (typically 23) which disturb the gas within the chamber as the blower rotates. This sets up waves with the chamber synchronized to the blower blade passage frequency. These waves modify the direction at which the laser beam enters the line narrowing package and thereby result in a narrow band error appearing in the wavelength output of the laser.

Typically, the blade passage frequency is outside of the highest achievable bandwidth of the PZT wavelength feedback controls. The controls therefore has almost no ability to reject these rapid disturbances.

The innovation discussed here is to employ adaptive feed forward control to cancel the disturbance. A sinusoidal signal synchronized to the blade passage frequency is passed through a filter and added to the LNP stack voltage. Control logic monitors the line center error and adjusts the filter parameters until the narrow band disturbance from the blower is cancelled. Methods for deriving the filter control logic are well known. A filtered LMS algorithm, for example, would work here.

To obtain a sinusoidal signal synchronized to the blower blade passage, a phase locked loop can be used. Typically a signal synchronized to the blade passage frequency is not directly available, however, a signal synchronized to the blower shaft rotation is. The trick is to use the phase locked loop to step up the frequency from shaft rotation frequency to the blade passage frequency. The output signal is generated by a voltage controlled oscillator (VCO). The square wave output of the VCO is passed through a step down counter which steps down the frequency of the VCO by a value equal to the number of blades on the blower. This signal and a square wave synchronized to the blower shaft are passed through a phase comparator to produce an error signal. This signal is filtered and fed back into the VCO. The dynamics of the compensating filter are adjusted to drive stabilize the system and drive the phase error to zero. The output of this system will be a sinusoid synchronized to the blade passage frequency as desired.

The response of the PZT is much faster than the blower blade repetition rate so that the PZT can react as necessary to cancel out blade effects. Since the blade disturbances are acoustic in nature the effects vary with laser gas temperature so when applying this technique gas temperature is preferably monitored and suitable correction factors are applied.

Mirror Position Detector for Predrive Control

As described above, center line wavelength is controlled in a feedback control system primarily by utilizing center line wavelength measurements made in wavemeter 104 as shown in FIG. 4. This arrangement requires recent historical data to provide precise results. Laser conditions change when the laser is not operating so the wavelength can be out of specification for the first few pulses after an idle period. Also, in some cases users want to change wavelength during operation so the first few pulses at the new wavelength may be out of specification. Prior art techniques for predrive of mirror 14 is to estimate the movement needed by stepper motor 82 or PZT 80 in order to achieve the needed wavelength adjustment. This is not very accurate.

A solution to this problem is to provide a mirror position sensor. One technique for detecting mirror position is described in U.S. Pat. No. 6,192,064 assigned to the assignee of this application which is incorporated herein by reference.

Another preferred position sensor technique is described below.

For PZT 80 the voltage applied is a function of the required pre-drive amount and a calibration constant. The calibration constant is derived from a test in which a linear relationship between PZT voltage and center wavelength is established. Unfortunately, the relationship between PZT voltage and Rmax position (and center wavelength) is not linear due to the presence of hysteresis in the PZT actuator. The hysteresis of the PZT actuator used in the LNM creates a positioning error of up to +/−10%. For a 0.8 pm pre-drive move, the center wavelength error at the start of the next burst (due to pre-drive) is +/−0.08 pm. Since customer specifications for center wavelength error average and sigma are typically in the range of 0.05 pm, a 10 pulse spec exclusion was negotiated with the customer to circumvent the issue of positioning error due to pre-drive. Within 10 pulses, the wavelength servo can reduce the positioning error to within the specification using data provided by the wavemeter after each pulse. A position sensor can be added to the LNM to improve $R_{max}$ positioning accuracy during pre-drive. With position data constantly available, even between bursts, the pre-drive motion can be performed under feedback control, eliminating the large effects of the PZT hysteresis on the wavelength error at the start of the next burst. This higher level of performance will enable the system to meet the original customer specification.

Figure 15:
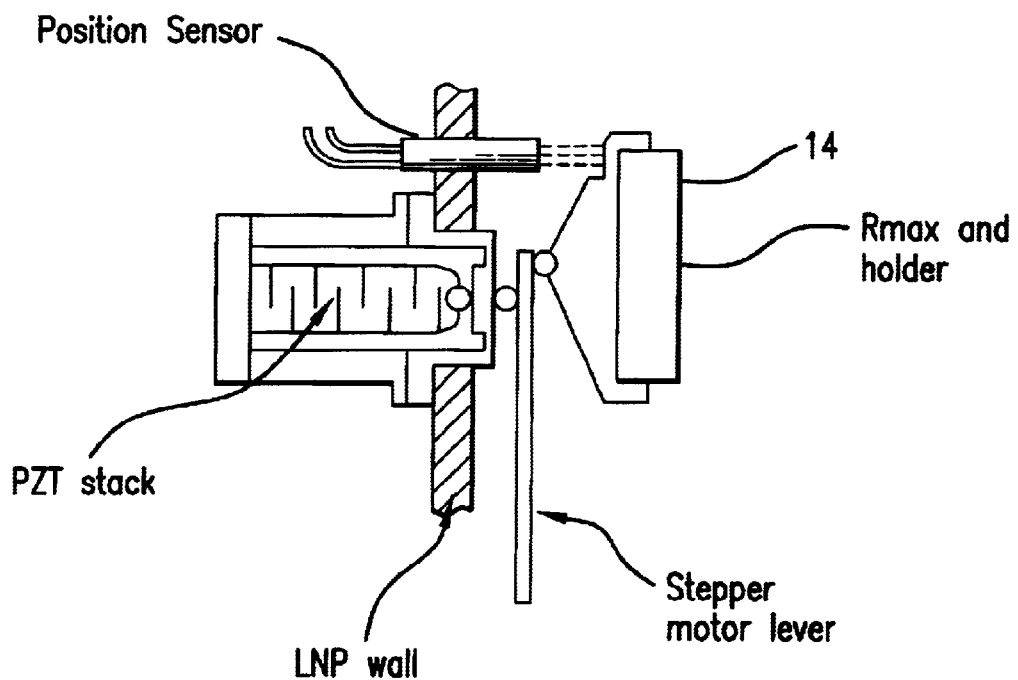
FIG. 15 show an embodiment with a mirror position detector.

The sketch in FIG. 15 shows one possible location for the position sensor. The non-contact position sensor types that will be described below (inductive, capacitive, or light reflective) are aimed at a point on the moving object. Ideally this "target" would be somewhere on the aluminum $R_{max}$ holder. It may be advantageous to made a modification to the $R_{max}$ holder to provide a better target for the sensor. The disconnected leads on the position sensor shown above would be connected to a power supply and possibly to some signal conditioning hardware that would be provided by the sensor supplier or built into existing laser electronics. The sensor signal, once properly processed, would be connected to one of the wavelength control units such as processor 106 or controller 102. The sensor body would be affixed to the LNP (LNM) wall.

The required range and resolution of the position sensor can be calculated from the range and resolution of the wavemeter or from the optical requirements of the laser. Since the wavemeter measures the center wavelength of the laser light, a proportionality constant must be calculated between the position of the $R_{max}$ and the light wavelength.

In a demonstration experiment, a 7 Volt input on the PZT produces a 1 pm wavelength shift in the wavemeter.

A 6.72V peak to peak low frequency sine wave input to the PZT produces a 1.12V peak to peak sine wave on a laser interferometer output where the laser is aimed at the side of the Rmax that is closest to the PZT and the laser interferometer gain is set to 0.5 micrometers/Volt.

Thus:

$$\frac{7 \, V_{PZT}}{1 pm_\lambda} \frac{1.12 \, V_{las}}{6.72 \, V_{PZT}} \frac{0.5 \mu m}{1 \, V_{las}} = 0.5833 \frac{\mu m}{pm_\lambda} \text{ (only one significant digit, 0.6)}$$

TABLE I

| Sensor Type | Inductive (eddy current) | Capacitive | Fiber Optic | Laser |
|---|---|---|---|---|
| Manufacturer | Kaman Instrumentation | Capacitec | Philtec | Keyence |
| Website | kamaninstrumentation.com | capacitec.com | philtec.com | keyence.com |
| Part # | SMU 9000/15N | HPB Series (HPB-40) | D63 | LC-2420 |
| Static Resolution | 2 nanometers | 2.5 nanometers | 10 nanometers | 10 nanometers |
| Range | 250 micrometers | 380 micrometers | 20 micrometers | 200 micrometers |
| Advantages | Small package, manufacturer can trade off resolution and range | Small package, large linear range | Very small sensor head, good high frequency performance | Good high frequency performance, good linearity |
| Disadvantages | Requires metal target | Target must be capacitively grounded, sensitive to particles | Low resolution and range | Low resolution, beefy electronics |
| Attached File | Kaman_SMU9000.pdf | Capacitec_Button.mht | Philtec_D63.pdf | Keyence_lc.pdf |

Table I shows four displacement sensor types. Refer to the attached files named in the table for a more detailed description of each sensor. From the choices shown in Table I, the inductive sensor from Kaman Instrumentation comes closest to meeting the preferred requirements. It should be noted that the SMU 9000/15N has been used in an application where the resolution was 0.25 nm and the range was 25 micrometers, demonstrating the potential flexibility in the trade off between range and resolution. While the bandwidth of the SMU 9000/15N is 10 kHz, the dynamic resolution of the inductive sensor increases (i.e. gets worse) at a rate proportional to the square root of the frequency of the signal in Hertz.

Other compelling capacitive sensor options are offered by ADE (ade.com) and Lion Precision (lionprecision.com). Both manufacturers offer products that are comparable to the inductive sensor from Kaman.

Sensor Error Compensation

There are three sources of sensor error than can affect the accuracy of the measurement and should be compensated for. The sources of error are: sensor non-linearity, thermal instability/expansion, and small $R_{max}$ angle approximation error. Sensor non-linearity and small angle approximation error can be compensated for together using a sensor calibration procedure. The sensor would be calibrated against the wavemeter, using as many points of calibration across the desired range of the sensor as needed. By using a high order polynomial curve fit or a large number of linearly interpolated points, the sensor's non-linear characteristic, including the non-linearity imposed by the kinematics of the $R_{max}$ can be reduced significantly. Since the sensors listed in Table I have very high sensing repeatability, an order of magnitude improvement in linearity can be achieved in this fashion. Error caused by thermal changes in the sensor and target can be reduced by adding a temperature sensor and adjusting the sensor signal based on the current temperature.

Many other embodiments of the present invention may be developed for accomplishing the same or similar goals in the laser system or another piece of capital equipment or subsystem for the semiconductor, electronics, optical, or medical markets. For example, other sensors may be used for control. Sensors considered would be suitably or sufficiently correlated with the performance metric (in the case of stability of the laser wavelength, the wavelength and it's standard deviation are exemplary performance metrics). In addition, sensors would also need to have adequate properties, including, resolution, accuracy, sensitivity, and signal bandwidth. Other sensors considered include strain sensors for measuring strain in a structure or component of the laser. Various position sensors also would be considered including capacitive, inductive, and optical displacement sensors. Acceleration sensors are also considered where appropriate. In addition, a sensor capable of faster measurement of the light signal could be of use in reducing vibration and thereby improving wavelength stability.

Other actuators are also considered for replacing or augmenting the stepper motor or the PZT stack. These include electromagnetic and inductive motors and rotary piezoceramic motors. Illumination angle control units other than mirror 14 could be used in lieu of or in addition to mirror 14. The stepper motor could be replaced with a second piezoelectric driver configured for greater angle control than driver 80 in FIG. 8. For example, a second piezoelectric driver could be used to pivot the grating and some of the controls which are described above for controlling mirror 14 could be used to control the pivot position of the grating. Since the grating is much heavier than mirror 14 the control system would preferably be designed for a slower pivot response of the grating. The stepper motor (or other similar driver) could also be configured to pivot the grating. One or more of the prisms could be pivoted to change the illumination angle on the grating. The mirror response could be speeded up by reducing its mass. One preferred technique is to use a light weight ceramic material for the mirror mount which now is made of aluminum.

In addition, alternate processors or active damping modules solutions are considered. For example, all processing could be performed using only one system suitably designed to deal with all the signal conditioning, power electronics, and controller processing, controller implementation, data logging, and other needs.

Therefore, the appended claims are to encompass within their scope all such changes and modifications as fall within the true spirit and scope of this invention.

We claim:

1. An electric discharge laser with precision wavelength control for controlling center wavelengths of laser beams produced by said laser said laser comprising:

A) a laser chamber,

B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan for circulating said laser gas within said chamber and through said discharge region, E) a wavemeter for measuring the centerline wavelength, F) a wavelength tuning mechanism comprising a tuning mirror and a piezoelectric driver for driving said tuning mirror, G) a first feedback control system for controlling said tuning mechanism using measurement information from said wavemeter, H) a load cell means for measuring vibrations of said tuning mirror, I) a second feedback control system for controlling said tuning mechanism based on signals from said load cell, wherein said second feedback control system comprises electronic equipment to control said piezoelectric driver based on measurements by said load cell.

2. A laser as in claim 1 and further comprising an active damping unit to damp movement of said tuning mirror based on measurements from said load cell.

3. A laser as in claim 1 and further comprising a processor configured with an algorithm for computing an inversion function for canceling or minimizing wavelength to transients associated with burst mode operation of said laser.

4. A laser as in claim 1 wherein said tuning mechanism comprises a stepper motor.

5. A laser as in claim 3 wherein said tuning mechanism comprises a processor programmed with a learning algorithm for learning the shape of the early occurring chirp.

6. A laser as in claim 1 wherein said tuning mechanism is to provide mirror adjustments in time periods of less than 2 milliseconds.

7. A laser as in claim 1 wherein said tuning mechanism is to provide mirror adjustments in time periods of less than 500 microseconds.

8. A laser as in claim 1 wherein said tuning mechanism also comprises a stepper motor having an external spindle.

9. A laser as in claim 1 wherein said tuning mechanism also comprises a lever arm pivoted about a pivot axis to provide a de-magnification of linear movements of said external spindle.

10. A laser as in claim 1 wherein said tuning mechanism comprises a stepper motor for coarse wavelength control and a piezoelectric device for fine wavelength control.

11. A laser as in claim 3 wherein said computer program comprises a learning algorithm permitting said program to learn needed adjustments of said tuning mirror to produce laser beams having wavelengths within a desired range.

12. A laser as in claim 1 wherein said tuning mechanism comprises a tuning mirror and an adjusting mechanism for adjusting the position of the tuning mirror in advance of a burst of pulses to mitigate a chirp occurring in an early part of the burst.

13. A laser as in claim 12 wherein said adjusting mechanism comprises a processor programmed with a learning algorithm for learning the shape of the early occupying chirp.

* * * * *